US012635365B2

(12) United States Patent     (10) Patent No.:   US 12,635,365 B2
Park et al.     (45) Date of Patent:     May 19, 2026

(54) DISPLAY DEVICE INCLUDING BRIDGE ELECTRODES WITH NESTED VOLTAGE TRANSMISSION LINES

(71) Applicant: Samsung Display Co., LTD., Yongin-si (KR)

(72) Inventors: Hyung Jun Park, Seoul (KR); Jun-Yong An, Asan-si (KR); Nu Ree Um, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 985 days.

(21) Appl. No.: 17/860,567

(22) Filed: Jul. 8, 2022

(65) Prior Publication Data

US 2023/0105246 A1     Apr. 6, 2023

(30) Foreign Application Priority Data

Sep. 27, 2021    (KR) ........................ 10-2021-0127035

(51) Int. Cl.
*H10K 59/131*     (2023.01)
*H10K 59/121*     (2023.01)

(52) U.S. Cl.
CPC ....... *H10K 59/131* (2023.02); *H10K 59/1213* (2023.02)

(58) Field of Classification Search
CPC ............... H10K 59/131; H10K 59/121; G09G 2300/0426
See application file for complete search history.

(56) References Cited

U.S. PATENT DOCUMENTS

| | | | |
|---|---|---|---|
| 9,397,150 B2 | 7/2016 | Kim et al. | |
| 10,411,083 B2 | 9/2019 | Song et al. | |
| 10,840,321 B2 | 11/2020 | Song et al. | |

(Continued)

FOREIGN PATENT DOCUMENTS

| | | |
|---|---|---|
| EP | 3 462 499 | 4/2019 |
| KR | 10-2017-0143066 | 12/2017 |

(Continued)

OTHER PUBLICATIONS

Extended European Search Report for European Application No. 22196327.5. dated Mar. 6, 2023.

*Primary Examiner* — William B Partridge
*Assistant Examiner* — Mehek Ahmed
(74) *Attorney, Agent, or Firm* — F. CHAU & ASSOCIATES, LLC

(57) ABSTRACT

A display device includes a substrate including a display area and a peripheral area; a first voltage line disposed on the display area of the substrate, a first voltage being applied to the first voltage line; a second voltage line disposed on the display area of the substrate and extending in a direction parallel to the first voltage line, a second voltage being applied to the second voltage line; a first voltage transmission line disposed on the peripheral area of the substrate and transmitting the first voltage; a second voltage transmission line disposed on the peripheral area of the substrate and transmitting the second voltage; a first bridge electrode electrically connecting the first voltage line and the first voltage transmission line; and a second bridge electrode electrically connecting the second voltage line and the second voltage transmission line.

22 Claims, 22 Drawing Sheets

(56)        References Cited

U.S. PATENT DOCUMENTS

| | | |
|---|---|---|
| 11,476,318 B2 | 10/2022 | Song et al. |
| 2018/0061908 A1* | 3/2018 | Shim .................. H10K 59/1213 |
| 2020/0185489 A1 | 6/2020 | Jo et al. |
| 2021/0202532 A1 | 7/2021 | Kim et al. |
| 2021/0225993 A1 | 7/2021 | Im et al. |
| 2022/0336569 A1 | 10/2022 | An et al. |
| 2023/0037775 A1 | 2/2023 | Song et al. |

FOREIGN PATENT DOCUMENTS

| | | |
|---|---|---|
| KR | 10-2019-0069062 | 6/2019 |
| KR | 10-2020-0001648 A | 1/2020 |
| KR | 10-2020-0138500 | 12/2020 |
| KR | 10-2021-0018561 | 2/2021 |
| KR | 10-2022-0143210 | 10/2022 |

* cited by examiner

DISPLAY DEVICE INCLUDING BRIDGE ELECTRODES WITH NESTED VOLTAGE TRANSMISSION LINES

CROSS-REFERENCE TO RELATED APPLICATION(S)

This application claims priority to and the benefit of Korean Patent Application No. 10-2021-0127035 under 35 U.S.C. § 119, filed in the Korean Intellectual Property Office (KIPO) on Sep. 27, 2021, the entire contents of which are incorporated herein by reference.

BACKGROUND

1. Technical Field

The disclosure relates to a display device.

2. Description of the Related Art

A display device is a device that displays a screen, and includes a liquid crystal display (LCD), an organic light emitting diode (OLED), and the like. The display device is used in various electronic devices such as a mobile phone, a navigation device, a digital camera, an electronic book, a portable game machine, and various terminals.

An organic light emitting diode (OLED) display includes two electrodes and an organic emission layer interposed therebetween. Electrons injected from one electrode and holes injected from another electrode are combined in the organic emission layer to generate excitons. The generated excitons are changed to a ground state from an exited state, releasing energy to emit light.

The organic light emitting diode display includes pixels including an organic light emitting diode as a self-emissive element, and transistors for driving the organic light emitting diode and at least one capacitor are formed in each pixel. In addition, the organic light emitting device may further include a voltage line to which a signal for driving pixels is applied, and a voltage transmission line for transmitting a signal to the voltage line. These voltage lines and voltage transmission lines may be connected at the edge of the display device, and in case that the connection structure is complicated, the region where the screen is not displayed (also called "a dead space") may become larger.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a display device capable of reducing a region in which an image is not displayed.

A display device according to an embodiment includes a substrate including a display area and a peripheral area; a first voltage line disposed on the display area of the substrate, a first voltage being applied to the first voltage line; a second voltage line disposed on the display area of the substrate and extending in a direction parallel to the first voltage line, a second voltage being applied to the second voltage line; a first voltage transmission line disposed on the peripheral area of the substrate and transmitting the first voltage; a second voltage transmission line disposed on the peripheral area of the substrate and transmitting the second voltage; a first bridge electrode disposed on the first edge of the substrate and connecting the first voltage line and the first voltage transmission line; and a second bridge electrode disposed on the second edge of the substrate and connecting the second voltage line and the second voltage transmission line.

The first edge and the second edge may face each other.

The first voltage and the second voltage may be constant, and the first voltage may be different from the second voltage.

The substrate may have a polygonal shape, each corner part of the substrate has a rounded shape, and the first bridge electrode and the second bridge electrode may be disposed at the each corner part.

The first bridge electrode and the second bridge electrode may extend in a first direction, and the first voltage line, and the second voltage line may extend in a second direction perpendicular to the first direction.

The first edge of the substrate may include a first corner part, a second corner part, and a first straight-line part disposed between the first corner part and the second corner part; the second edge of the substrate may include a third corner part, a fourth corner part, and a second straight-line part disposed between the third corner part and the fourth corner part; the first bridge electrode may be disposed on the first corner part and the second corner part, and is not disposed on the third corner part and the fourth corner part; and the second bridge electrode may be disposed on the third corner part and the fourth corner part, and is not disposed on the first corner part and the second corner part.

The first voltage line and the first voltage transmission line may be electrically connected over the first corner part and the second corner part, and may be electrically disconnected over the third corner part and the fourth corner part, and the second voltage line and the second voltage transmission line may be electrically connected over the third corner part and the fourth corner part, and may be electrically disconnected over the first corner part and the second corner part.

The display device according to an embodiment may further include a third bridge electrode disposed on the first straight-line part of the first edge of the substrate and electrically connecting the first voltage line and the first voltage transmission line; and a fourth bridge electrode disposed on the second straight-line part of the second edge of the substrate and electrically connecting the first voltage line and the first voltage transmission line. The third bridge electrode and the fourth bridge electrode may extend in the second direction, the first voltage transmission line and the second voltage transmission line may have a shape surrounding the display area in a plan view, and the first voltage transmission line may be disposed outside the second voltage transmission line.

The second voltage line and the second voltage transmission line may be directly connected on the first straight-line part and the second straight-line part.

The display device according to an embodiment may further include a third bridge electrode disposed on the first straight-line part of the first edge of the substrate and electrically connecting the first voltage line and the first voltage transmission line, the third bridge electrode may extend in the second direction, the first voltage line and the first voltage transmission line may be electrically disconnected on the second straight-line part of the second edge of the substrate, the first voltage transmission line and the second voltage transmission line may have a shape surrounding the display area in a plan view, and the first voltage transmission line may be disposed outside the second voltage transmission line.

The second voltage line and the second voltage transmission line may be directly connected on the second straight-line part, and electrically disconnected on the first straight-line part.

The display device according to an embodiment may further include a semiconductor layer disposed on the substrate and including a channel, a first region and a second region of a first transistor, a channel of a first region and a second region of a second transistor, and a channel, a first region, and a second region of a third transistor; a gate conductor including a gate electrode of the first transistor overlapping the channel of the first transistor in a plan view, a gate electrode of the second transistor overlapping the channel of the second transistor in a plan view, and a gate electrode of the seventh transistor overlapping the channel of the third transistor in a plan view; and a data conductor including a connection electrode electrically connecting a gate electrode of the first transistor and a second region of the second transistor.

The first voltage line may be electrically connected to the first region of the second transistor, and the first voltage may be a first initialization voltage.

The first voltage line and the data conductor may be disposed on a same layer.

The first voltage transmission line and the data conductor may be disposed on a same layer.

The second voltage line may be electrically connected to the second region of the third transistor, and the second voltage may be a second initialization voltage.

The second voltage line and the data conductor may be disposed on a same layer.

The second voltage transmission line and the data conductor may be disposed on a same layer.

The first bridge electrode, the second bridge electrode, and the gate conductor may be disposed on a same layer.

The display device according to an embodiment may further include a data line and a driving voltage line extending in a direction parallel to the first voltage line and the second voltage line, and the data line, the driving voltage line, and the data conductor may be disposed on a same layer.

The data line and the driving voltage line may be disposed between the first voltage line and the second voltage line in a plan view.

The display device may include pixels, each the pixels may include the first transistor, the second transistor, and the third transistor, and the pixels may have a symmetrical shape with respect to the second voltage line.

According to embodiments, the region where an image is not displayed may be reduced in the display device.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9 is a schematic plan view showing some constituent elements of a display device according to an embodiment.

FIG. 16 is a schematic enlarged plan view of some region of FIG. 13.

Figure 20:
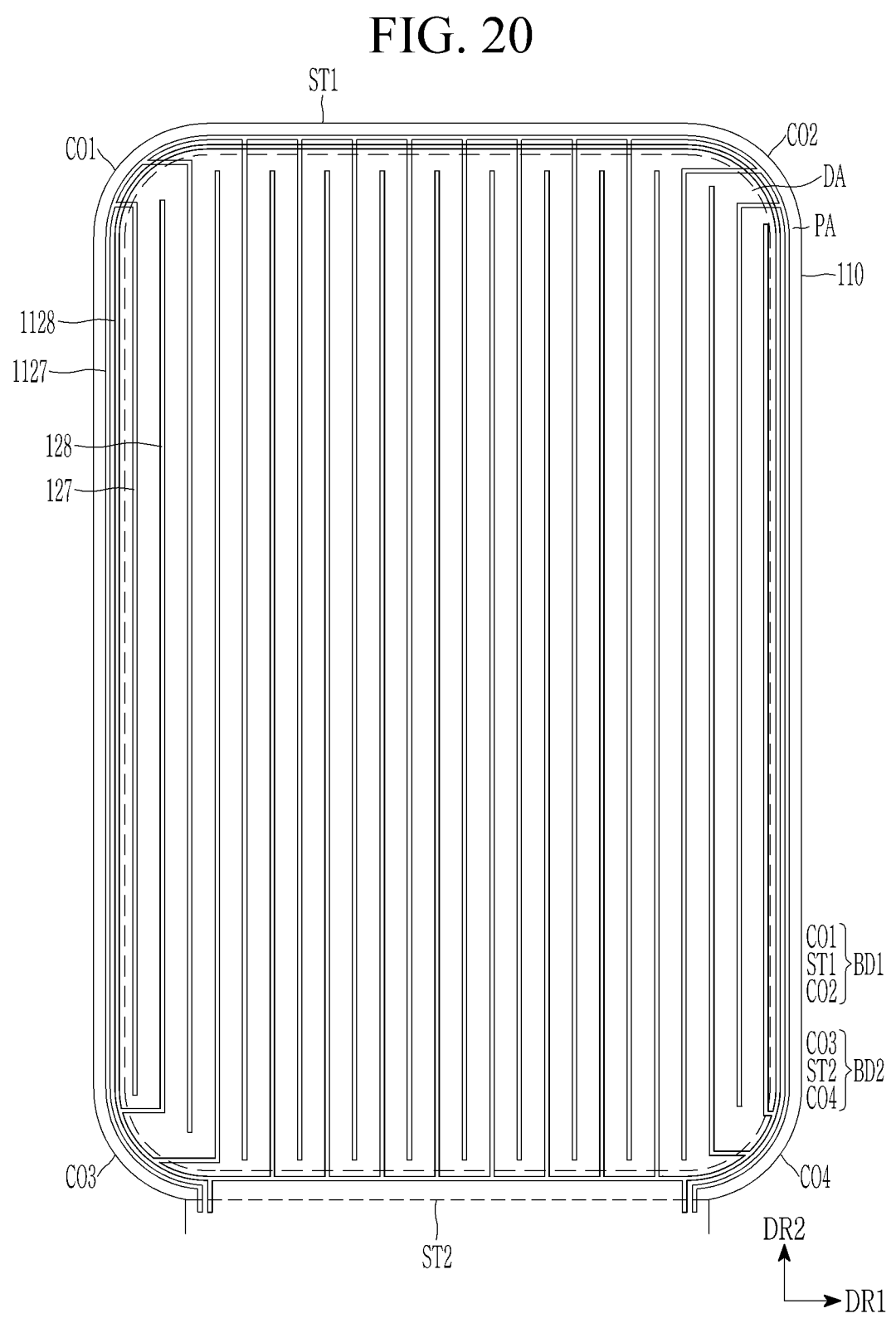

FIG. 20 is a schematic plan view showing some constituent elements of a display device according to an embodiment.

FIG. 21 and FIG. 22 are schematic plan views showing some region of a display device according to an embodiment.

DETAILED DESCRIPTION OF THE EMBODIMENTS

Figure 1:
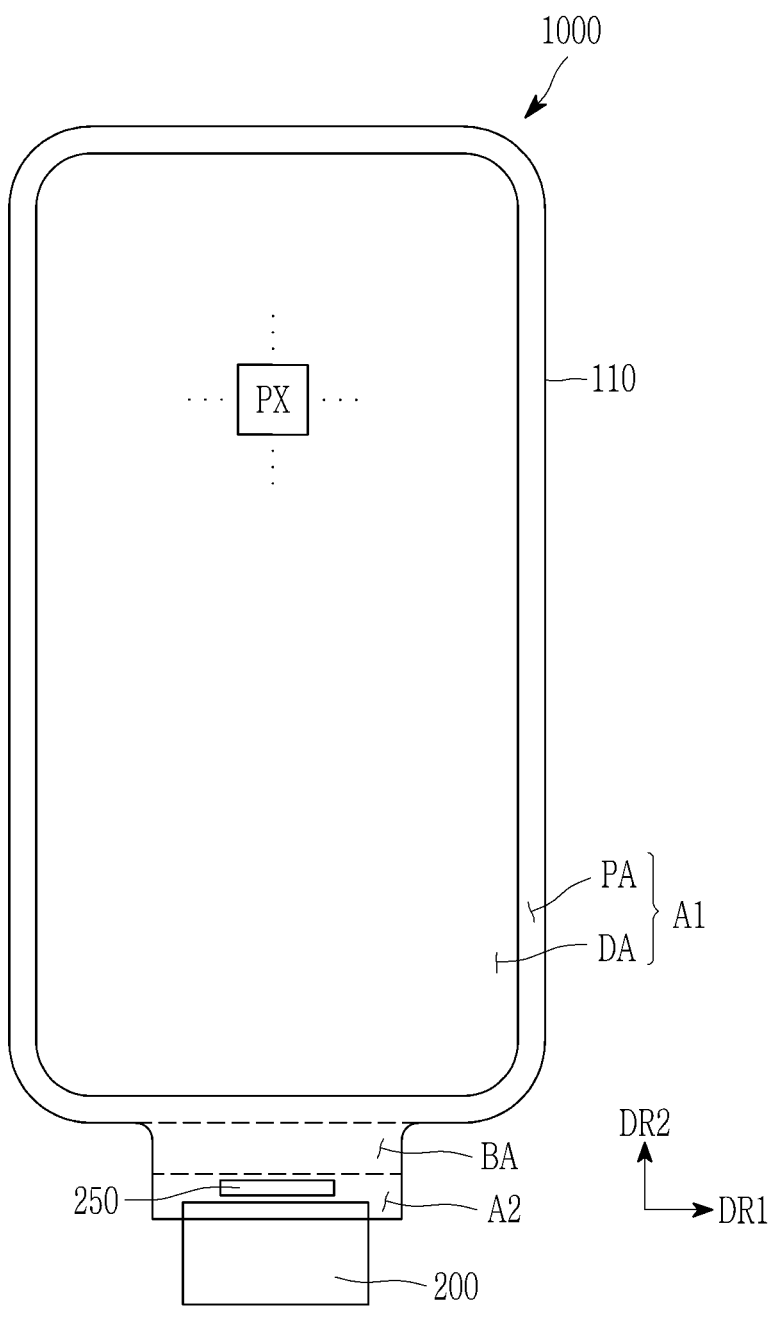
FIG. 1 is a schematic plan view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Descriptions of parts not related to the disclosure are omitted, and like reference numerals designate like elements throughout the specification.

Further, since sizes and thicknesses of elements shown in the accompanying drawings are arbitrarily given for better understanding and ease of description, the disclosure is not limited to the illustrated sizes and thicknesses. In the drawings, the thickness of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed or positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" or "in a plan view" means viewing a target portion from the top, and the phrase "on a cross-section" means viewing a cross-section formed by vertically cutting a target portion from the side.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

First, a display device according to an embodiment is described with reference to FIG. 1.

FIG. 1 is a schematic plan view showing a display device according to an embodiment.

As shown in FIG. 1, a display device 1000 according to an embodiment includes a substrate 110 and pixels PX positioned on (or disposed on) the substrate 110.

The substrate 110 may include a first region A1, a second region A2, and a bending region BA positioned between the first region A1 and the second region A2. The substrate 110 may be made of a flexible material and may be changed into various shapes. The substrate 110 may be flexible, stretchable, foldable, bendable, or rollable. The bending region BA may be a region in which the substrate 110 is bent. The first region A1 and the second region A2 may have a flat shape. However, this is only an example, and the substrate 110 may additionally include a region to be bent. For example, at least a portion of the first region A1 or the second region A2 of the substrate 110 may be bent.

The first region A1 of the substrate 110 extends from the bending region BA. The first region A1 may be approximately formed as a rectangle including a long side and a short side, and a corner portion may be chamfered to have a rounded shape. However, the shape of the first region A1 is only an example and may be changed to various shapes. The first region A1 may include a display area DA and a peripheral area PA. The display area DA may be positioned in the center of the first region A1, and may have a shape approximately similar to that of the first region A1. The peripheral area PA may surround the display area DA. For example, the peripheral area PA may be positioned outside the first region A1.

Pixels PX may be positioned in the display area DA. Pixels PX may be disposed in a matrix form, and may receive an image signal and display an image accordingly. In this case, the arrangement shape of pixels PX may be variously changed. Although not shown in the drawings, the display device according to an embodiment may further include signal lines. The signal lines may include scan lines, light emission control lines, data lines, first initialization voltage lines, second initialization voltage lines, driving voltage lines, and the like. Theses signal lines may transmit a scan signal, a light emission control signal, a data signal, a first initialization voltage, a second initialization voltage, a driving voltage, and the like. Signal lines may be positioned to intersect each other in the first direction DR1 or the second direction DR2. In this case, the first direction DR1 may be a row direction, and the second direction DR2 may be a column direction. Also, each pixel PX may include transistors, a capacitor, and at least one light-emitting diode (LED), which are electrically connected to signal lines. For example, the display device according to an embodiment may be an organic light emitting device. However, the type of display device is not limited thereto, and various types of the display devices may be used. For example, the display device may be formed as a liquid crystal display, an electrophoretic display, or an electrowetting display device. In addition, the display device may be a next-generation display device such as a micro light emitting diode (Micro LED) display device, a quantum dot light-emitting diode (QLED) display device, and a quantum dot organic light-emitting diode (QD-OLED) display device.

A voltage transmission line for transmitting a voltage to signal lines may be positioned in the peripheral area PA. In this case, the voltage transmission line may be formed to surround the display area DA. The voltage transmission line may include a first initialization voltage transmission line, a second initialization voltage transmission line, and the like. The first initialization voltage transmission line may be electrically connected to the first initialization voltage line to transmit the first initialization voltage. The second initialization voltage transmission line may be electrically connected to the second initialization voltage line to transmit the second initialization voltage.

The second region A2 of the substrate 110 extends from the bending region BA. The second region A2 is a non-display area that does not display an image and does not include pixels PX. Elements and/or wires for generating and/or transmitting various signals applied to the pixel PX are located in the second region A2.

A driving circuit chip 250 and a flexible circuit board 200 may be positioned on the second region A2. The driving circuit chip 250 is electrically connected to the elements or wires positioned in the second region A2 to transmit various signals to pixels PX. For example, the driving circuit chip 250 may supply a scan signal, a control signal, a data signal, and the like. The flexible circuit board 200 may be attached to the edge of the second region A2 of the substrate 110. The flexible circuit board 200 may be made of a flexible material. The flexible circuit board 200 has a circuit designed to control the operation of the display device.

The bending region BA of the substrate 110 may be positioned between the first region A1 and the second region A2 to electrically connect the first region A1 to the second region A2. In case that the substrate 110 is bent, the first region A1 and the second region A2 may overlap each other. The bending region BA of the substrate 110 may be positioned so that it is connected (or extended) to a short side of the first region A1. However, the position of the bending region BA is only an example and may be variously changed. For example, the bending region BA may be positioned so that it is connected to short sides of the first region A1, or it may be positioned so that it is connected to a long side of the first region A1.

Hereinafter, a pixel of the display device according to an embodiment is described with reference to FIG. 2.

Figure 2:
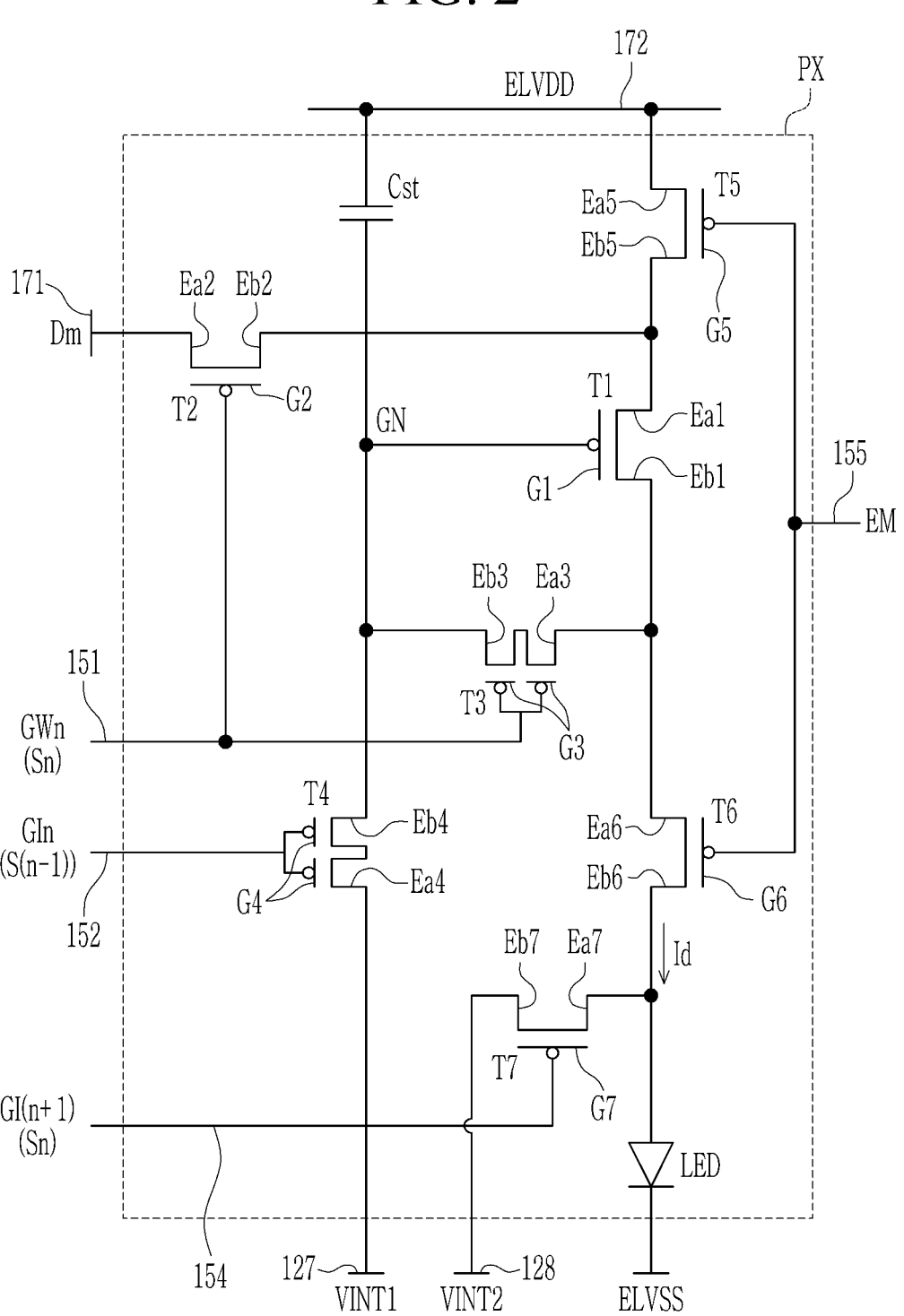
FIG. 2 is a schematic diagram of an equivalent circuit of a pixel of a display device according to an embodiment.

FIG. 2 is a schematic diagram of an equivalent circuit of a pixel of a display device according to an embodiment.

As shown in FIG. 2, the display device according to an embodiment includes pixels PX capable of displaying an image and signal lines 127, 128, 151, 152, 154, 155, 171, and 172. A pixel PX includes transistors T1, T2, T3, T4, T5, T6, and T7 electrically connected to the signal lines 127, 128, 151, 152, 154, 155, 171, and 172, a capacitor Cst, and at least one light-emitting diode LED. In the embodiment, an example in which a pixel PX includes a light-emitting diode LED is described.

The signal lines 127, 128, 151, 152, 154, 155, 171, and 172 may include a first initialization voltage line (or first voltage line) 127, a second initialization voltage line (or second voltage line) 128, scan lines 151, 152, and 154, a light emission control line 155, a data line 171, and a driving voltage line 172.

The first initialization voltage line 127 may transmit a first initialization voltage VINT1, and the second initialization voltage line 128 may transmit a second initialization voltage VINT2. The scan lines 151, 152, and 154 may transmit scan signals GWn, GIn, and GI(n+1), respectively. The scan signals GWn, GIn, and GI(n+1) may transmit a gate-on voltage and a gate-off voltage that can turn on or off the transistors T2, T3, T4, and T7 included in the pixel PX.

The scan lines 151, 152, and 154 electrically connected to a pixel PX may include a first scan line 151 capable of transmitting a scan signal GWn, a second scan line 152 capable of transmitting a scan signal GIn having a gate-on voltage at different timing from that of the first scan line 151, and a third scan line 154 capable of transmitting a scan signal GI(n+1). In the embodiment, an example in which the second scan line 152 transmits the gate-on voltage at earlier timing than the first scan line 151 is described. For example, in case that the scan signal GWn is an n-th scan signal Sn among scan signals applied during a frame (where n is a natural number of 1 or more), the scan signal GIn may be a previous scan signal such as an (n−1)-th scan signal S(n−1), and the scan signal GI(n+1) may be an n-th scan signal Sn. However, the embodiment is not limited thereto, and the scan signal GI(n+1) may be a different scan signal from the n-th scan signal Sn.

The light emission control line 155 may transmit a control signal, and particularly may transmit a light emission control signal EM capable of controlling emission of the ight-emitting diode LED included in the pixel PX. The control signal transmitted by the light emission control line 155 may consist of a gate-on voltage and a gate-off voltage, and may have a different waveform from the scan signal transmitted by the scan lines 151, 152, and 154.

The data line 171 may transmit a data signal Dm, and the driving voltage line 172 may transmit a driving voltage ELVDD. The data signal Dm may have other voltage levels according to the image signal input to the display device, and the driving voltage ELVDD may have a substantially constant level.

Although not shown in the drawings, the display device may further include a driver for transmitting signals to signal lines 127, 151, 152, 154, 155, 171, and 172.

Transistors T1, T2, T3, T4, T5, T6, and T7 included in a pixel PX include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal GIn to the fourth transistor T4, the third scan line 154 may transmit the scan signal GI(n+1) to the seventh transistor T7, and the light emission control line 155 may transmit the light emission control signal EM to the fifth transistor T5 and the sixth transistor T6.

A gate electrode G1 of the first transistor T1 is electrically connected to a first terminal of the capacitor Cst through a driving gate node GN, a first electrode Ea1 of the first transistor T1 is electrically connected to the driving voltage line 172 via the fifth transistor T5, and a second electrode Eb1 of the first transistor T1 is electrically connected to an anode of the light-emitting diode LED via the sixth transistor T6. The first transistor T1 may receive the data signal Dm transmitted by the data line 171 depending on the switching operation of the second transistor T2 to supply a driving current Id to the light-emitting diode LED.

A gate electrode G2 of the second transistor T2 is electrically connected to the first scan line 151, a first electrode Ea2 of the second transistor T2 is electrically connected to the data line 171, and a second electrode Eb2 of the second transistor T2 is electrically connected to the first electrode Ea1 of the first transistor T1 and is electrically connected to the driving voltage line 172 via the fifth transistor T5. The second transistor T2 is turned on depending on the scan signal GWn transmitted through the first scan line 151, thereby transmitting the data signal Dm, transmitted from the data line 171, to the first electrode Ea1 of the first transistor T1.

A gate electrode G3 of the third transistor T3 is electrically connected to the first scan line 151, and a first electrode Ea3 of the third transistor T3 is electrically connected to the second electrode Eb1 of the first transistor T1 and is electrically connected to the anode of the light-emitting diode LED via the sixth transistor T6. A second electrode Eb3 of the third transistor T3 is electrically connected to a second electrode Eb4 of the fourth transistor T4, the first terminal of the capacitor Cst, and the gate electrode G1 of the first transistor T1. The third transistor T3 is turned on depending on the scan signal GWn transmitted through the first scan line 151 to electrically connect the gate electrode G1 and the second electrode Eb1 of the first transistor T1 to each other, thereby electrically diode-connecting the first transistor T1.

A gate electrode G4 of the fourth transistor T4 is electrically connected to the second scan line 152, a first electrode Ea4 of the fourth transistor T4 is electrically connected to the first initialization voltage line 127, and the second electrode Eb4 of the fourth transistor T4 is electrically connected to the first terminal of the capacitor Cst and the gate electrode G1 of the first transistor T1 through the second electrode Eb3 of the third transistor T3. The fourth transistor T4 is turned on depending on the scan signal GIn transmitted through the second scan line 152 to transmit the first initialization voltage VINT1 to the gate electrode G1 of the first transistor T1, thereby performing an initialization operation of initializing the voltage of the gate electrode G1 of the first transistor T1.

A gate electrode G5 of the fifth transistor T5 is electrically connected to the light emission control line 155, a first electrode Ea5 of the fifth transistor T5 is electrically connected to the driving voltage line 172, and a second electrode Eb5 of the fifth transistor T5 is electrically connected to the first electrode Ea1 of the first transistor T1 and the second electrode Eb2 of the second transistor T2.

A gate electrode G6 of the sixth transistor T6 is electrically connected to the light emission control line 155, a first electrode Ea6 of the sixth transistor T6 is electrically connected to the second electrode Eb1 of the first transistor T1 and the first electrode Ea3 of the third transistor T3, and a second electrode Eb6 of the sixth transistor T6 is electrically connected to the anode of the light-emitting diode LED. The fifth transistor T5 and the sixth transistor T6 are simultaneously turned on depending on the light emission control signal EM transmitted through the light emission control line 155, thereby transmitting the driving voltage ELVDD to the light-emitting diode LED through the diode-connected first transistor T1.

A gate electrode G7 of the seventh transistor T7 is electrically connected to the third scan line 154, a first electrode Ea7 of the seventh transistor T7 is electrically connected to the second electrode Eb6 of the sixth transistor T6 and the anode of the light-emitting diode LED, and a second electrode Eb7 of the seventh transistor T7 is electrically connected to the second initialization voltage line 128. The seventh transistor T7 is turned on according to the scan signal GI(n+1) received through the third scan line 154 and transmits the second initialization voltage VINT2 to the anode of the light-emitting diode LED, thereby serving to initialize the anode of the light-emitting diode LED. In the embodiment, different initialization voltages may be applied to the fourth transistor T4 and the seventh transistor T7. For example, the first initialization voltage VINT1 may be applied to the fourth transistor T4, and the second initialization voltage VINT2 may be applied to the seventh transistor T7. Therefore, it is possible to improve the characteristic of the display device according to an embodiment.

The transistors T1, T2, T3, T4, T5, T6, and T7 may be P-type channel transistors such as a P-channel metal oxide semiconductor (PMOS), but are not limited thereto, and at least one among the transistors T1, T2, T3, T4, T5, T6, and T7 may be an N-type channel transistor and may include both a P-type and an N-type channel transistor.

The first terminal of the capacitor Cst is electrically connected to the gate electrode G1 of the first transistor T1 as described above and a second terminal is electrically connected to the driving voltage line 172. The cathode of the light-emitting diode LED is electrically connected to a common voltage ELVSS terminal that transmits a common voltage ELVSS, so that the common voltage ELVSS may be applied thereto.

The structure of the pixel PX according to an embodiment is not limited to the structure shown in FIG. 2, and the number of transistors and the number of capacitors included in a pixel PX and the connection relationship therebetween may be variously modified.

Hereinafter, the interlayer structure of a pixel of the display device according to an embodiment will be further described with reference to FIGS. 3 to 8.

Figure 3:
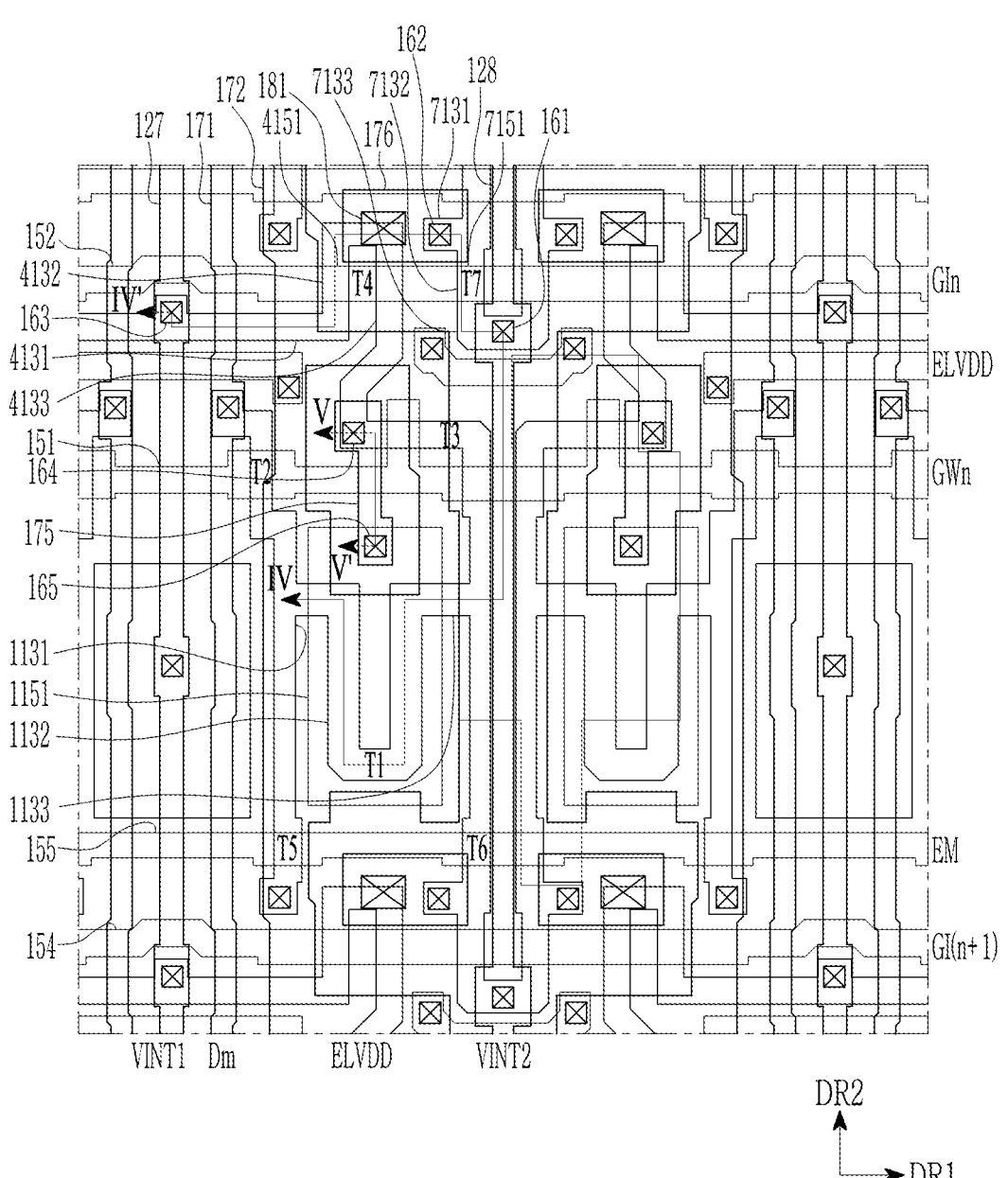
FIG. 3 is a schematic plan view showing a part of a display device according to an embodiment.
Figure 4:
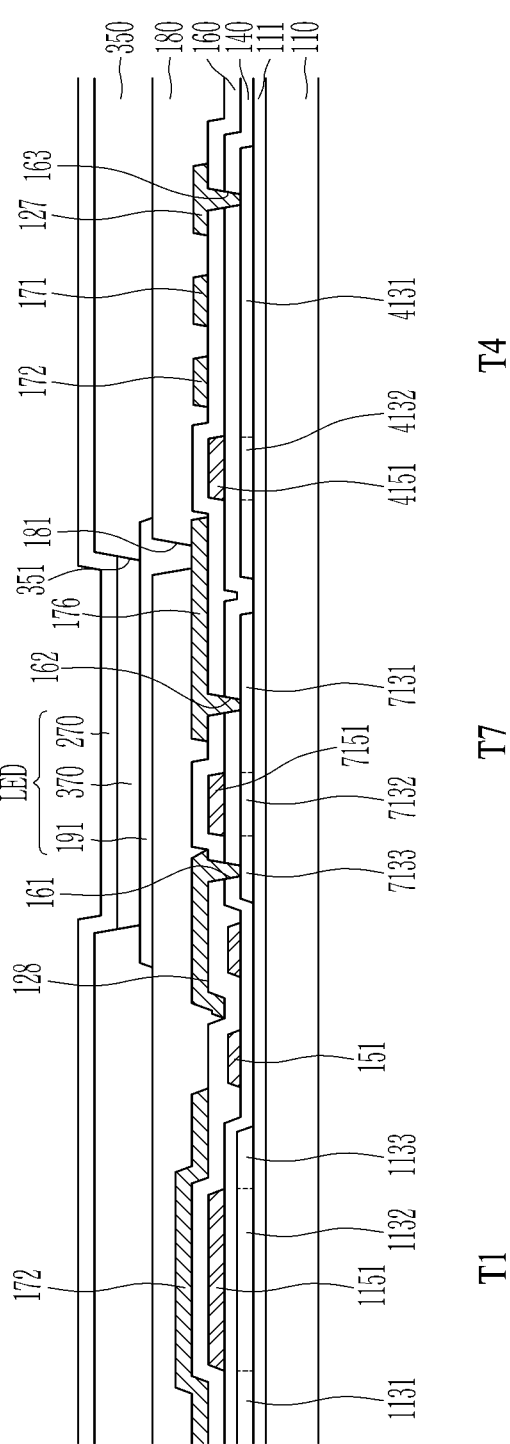
FIG. 4 is a schematic cross-sectional view of a display device according to an embodiment taken along line IV-IV' of FIG. 3.
Figure 5:
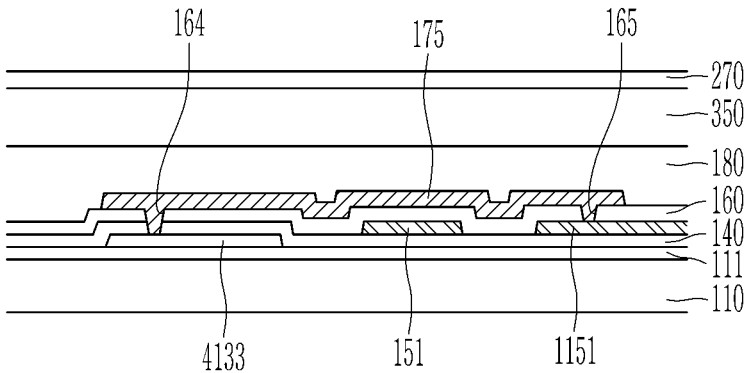
FIG. 5 is a schematic cross-sectional view of a display device according to an embodiment taken along line V-V' of FIG. 3.
Figure 6:
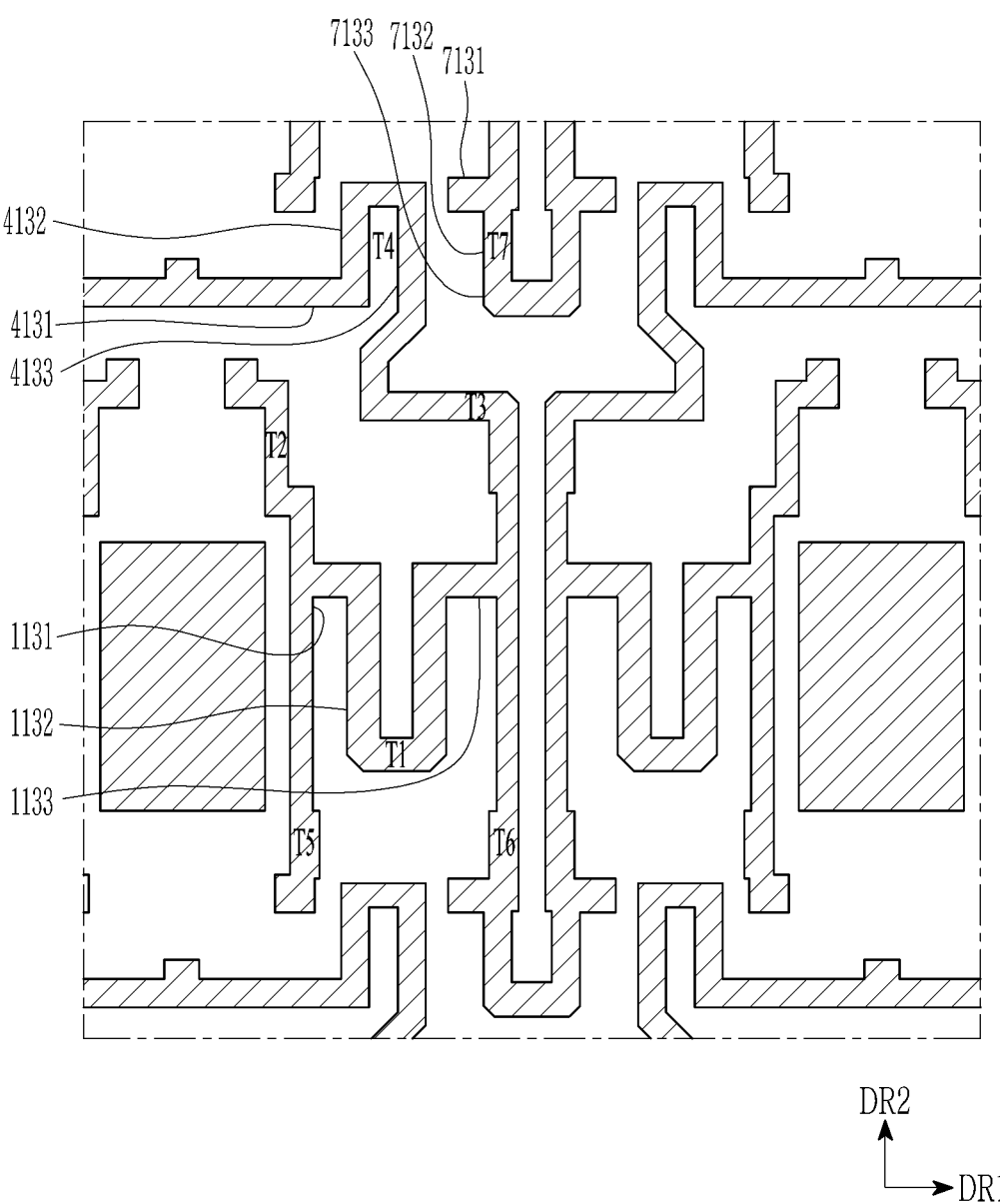
FIG. 6 to FIG. 8 are schematic plan views sequentially showing a display device according to an embodiment according to a manufacturing order.
Figure 7:
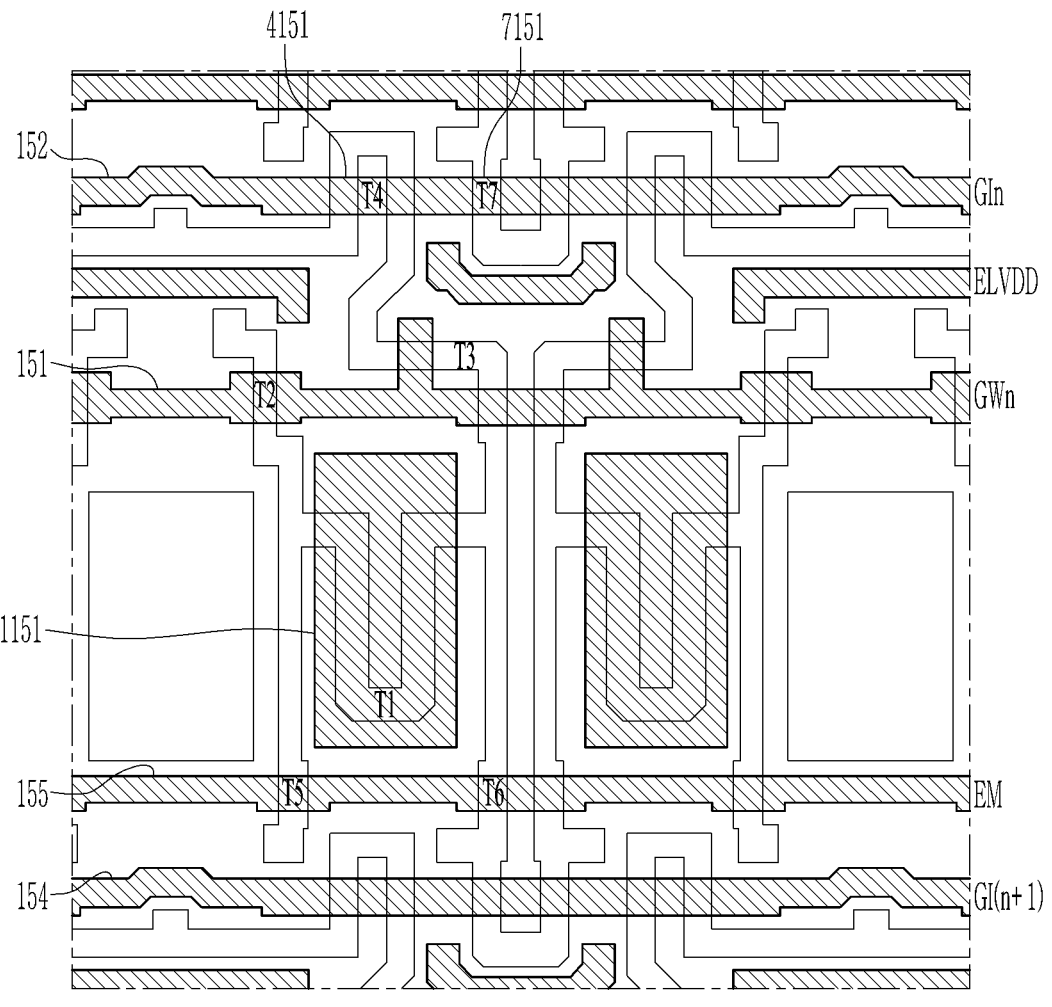
Figure 8:
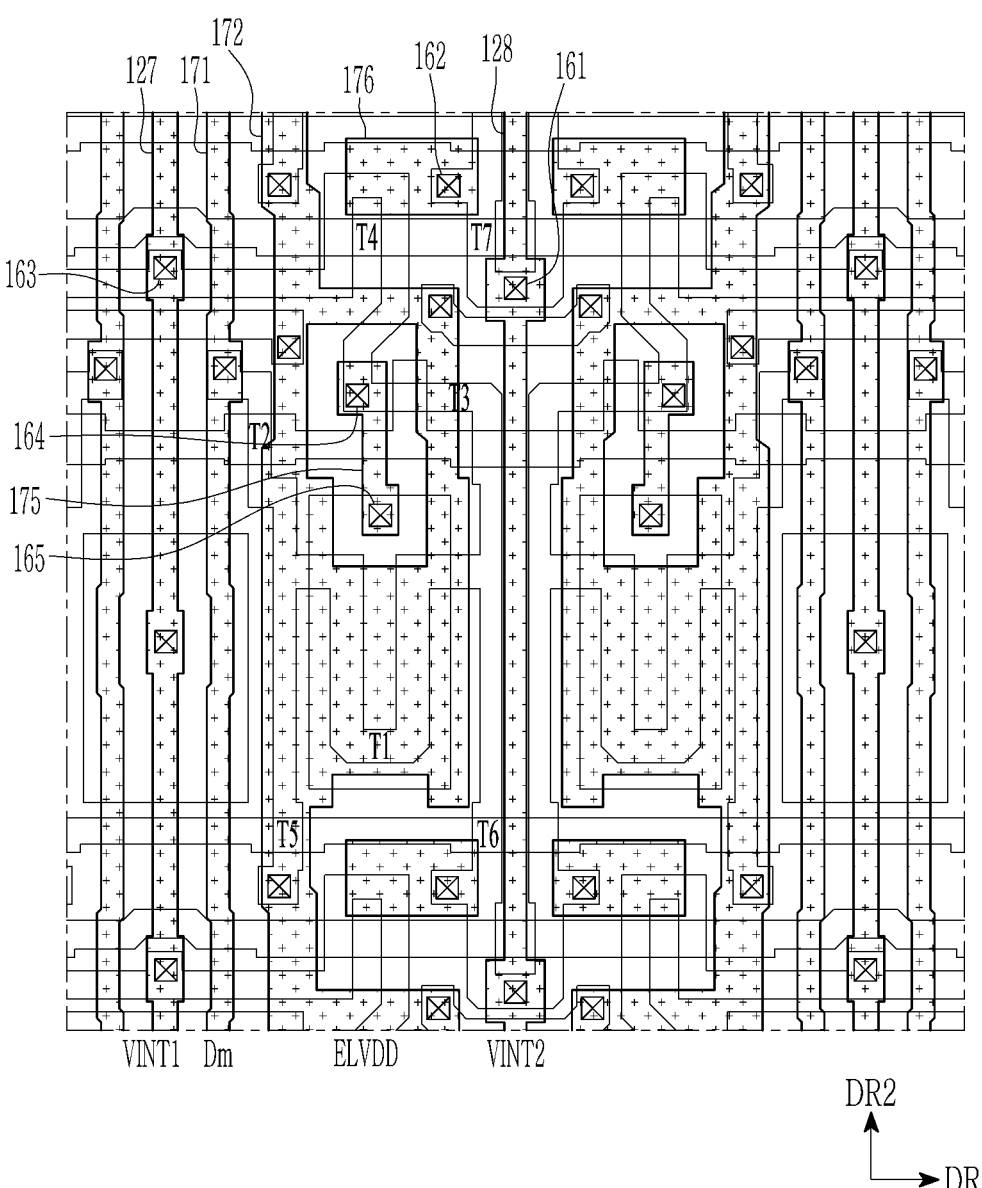

FIG. 3 is a schematic plan view illustrating a part of a display device according to an embodiment, FIG. 4 is a schematic cross-sectional view of a display device according to an embodiment taken along line IV-IV' of FIG. 3, and FIG. 5 is a schematic cross-sectional view of a display device according to an embodiment taken along line V-V' of FIG. 3. FIGS. 6 to 8 are schematic plan views sequentially illustrating a display device according to an embodiment an according to a manufacturing order. FIGS. 3 to 8 illustrate two adjacent pixels positioned in the display area of a display device according to an embodiment. In this case, two adjacent pixels may have planar structures that are symmetrical to each other. However, the disclosure is not limited thereto, and two adjacent pixels may have a same planar structure.

As shown in FIGS. 3 to 8, the display device according to an embodiment may include a substrate 110. The substrate 110 may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may be single-layered or multi-layered. The substrate 110 may have a structure in which at least one base layer and at least one inorganic layer, including a polymer resin sequentially stacked, are alternately stacked.

A semiconductor layer including a channel 1132, a first region 1131, and a second region 1133 of the first transistor T1 may be positioned on the substrate 110. FIG. 6 illustrates a semiconductor layer. The semiconductor layer may further include a channel 4132, a first region 4131, and a second region 4133 of the fourth transistor T4, and a channel 7132, a first region 7131, and a second region 7133 of the seventh transistor T7 as well as the first transistor T1. In addition, the semiconductor layer may further include a channel, a first region, and a second region of each of the second transistor T2, the third transistor T3, the fifth transistor T5, and the sixth transistor T6.

The channel 1132 of the first transistor T1 may have a U shape in a plan view. However, the shape of the channel 1132 of the first transistor T1 is not limited thereto, and may be variously changed. For example, the channel 1132 of the first transistor T1 may be bent into a different shape or may be formed into a bar shape. The first region 1131 and the second region 1133 of the first transistor T1 may be positioned on respective sides of the channel 1132 of the first transistor T1. The first region 1131 of the first transistor T1 may extend up and down in a plan view, so that a portion thereof extending downward may be electrically connected to the second region of the fifth transistor T5, and a portion thereof extending upward may be electrically connected to the second region of the second transistor T2. The second region 1133 of the first transistor T1 may extend up and down in a plan view, so that a portion thereof extending downward may be electrically connected to the first region of the sixth transistor T6, and a portion thereof extending upward may be electrically connected to the first region of the third transistor T3.

The fourth transistor T4 may include two channels 4132, the first region 4131 may be positioned on a side of a channel 4132, and the second region 4133 may be positioned on a side of the other channel 4132. The second region 4133 of the fourth transistor T4 may extend downward in a plan view to be electrically connected to the second region of the third transistor T3.

The first region 7131 and the second region 7133 of the seventh transistor T7 may be positioned on respective sides of the channel 7132 of the seventh transistor T7. The first region 7131 of the seventh transistor T7 may extend upward in a plan view to be electrically connected to the second region of the sixth transistor T6.

A buffer layer 111 may be positioned between the substrate 110, and the semiconductor layer including the channel 1132, the first region 1131, and the second region 1133 of the first transistor T1, the channel 4132, the first region 4131, and the second region 4133 of the fourth transistor T4, and the channel 7132, the first region 7131, and the second region 7133 of the seventh transistor T7. The buffer layer 111 may have a single-layer or a multi-layered structure. The buffer layer 111 may include an inorganic insulating material or an organic insulating material such as a silicon nitride ($SiN_x$), a silicon oxide ($SiO_x$), or a silicon oxynitride ($SiO_xN_y$). In addition, a barrier layer may be further positioned between the substrate 110 and the buffer layer 111. The barrier layer may have a single-layer or a multi-layered structure. The barrier layer may include an inorganic insulating material such as a silicon nitride ($SiN_x$), a silicon oxide ($SiO_x$), or a silicon oxynitride ($SiO_xN_y$).

A gate insulating layer 140 may be positioned on the semiconductor layer including the channel 1132, the first region 1131, and the second region 1133 of the first transistor T1, the channel 4132, the first region 4131, and the second region 4133 of the fourth transistor T4, and the channel 7132, the first region 7131, and the second region 7133 of the seventh transistor T7. The gate insulating layer 140 may have a single-layer or a multi-layered structure. The gate insulating layer 140 may include an inorganic insulating material such as a silicon nitride (SiN$_x$), a silicon oxide (SiO$_x$), or a silicon oxynitride (SiO$_x$N$_y$). A gate conductor including a gate electrode 1151 of the first transistor T1 may be positioned on the gate insulating layer 140. FIG. 7 illustrates together the semiconductor layer and the gate conductor.

The gate conductor may have a single-layer or a multi-layered structure. The gate conductor may include a metal material such as molybdenum (Mo), aluminum (A1), copper (Cu), and/or titanium (Ti). The gate conductor may further include a gate electrode 4151 of the fourth transistor T4 and a gate electrode 7151 of the seventh transistor T7 as well as the first transistor T1. In addition, the gate conductor may further include gate electrodes of each of the second transistor T2, the third transistor T3, the fifth transistor T5, and the sixth transistor T6.

The gate electrode 1151 of the first transistor T1 may overlap the channel 1132 of the first transistor T1. The channel 1132 of the first transistor T1 is covered by the gate electrode 1151 of the first transistor T1. The gate electrode 4151 of the fourth transistor T4 may overlap the channel 4132 of the fourth transistor T4, and the gate electrode 7151 of the seventh transistor T7 may overlap the channel 7132 of the seventh transistor T7.

The gate conductor may further include a first scan line 151, a second scan line 152, a third scan line 154, and a light emission control line 155. The first scan line 151, the second scan line 152, the third scan line 154, and the light emission control line 155 may extend in parallel to each other. The first scan line 151, the second scan line 152, the third scan line 154, and the light emission control line 155 may extend approximately in the first direction DR1. In this case, the first direction DR1 may be a row direction.

The first scan line 151 is electrically connected to the gate electrode of the second transistor T2 and the gate electrode of the third transistor T3, and may transmit the scan signal GWn. The first scan line 151 may be integral with (or may be formed integrally with) the gate electrode of the second transistor T2 and the gate electrode of the third transistor T3.

The second scan line 152 is electrically connected to the gate electrode 4151 of the fourth transistor T4, and may transmit the scan signal GIn. The second scan line 152 may be integral with the gate electrode 4151 of the fourth transistor T4. The second scan line 152 may be electrically connected to the gate electrode 7151 of the seventh transistor T7 positioned at the pixel of a previous stage. For example, the third scan line 154 electrically connected to the seventh transistor T7 may be the first scan line at a rear stage.

The light emission control line 155 is electrically connected to the gate electrode of the fifth transistor T5 and the gate electrode of the sixth transistor T6, and may transmit the light emission control signal EM. The light emission control line 155 may be integral with the gate electrode of the fifth transistor T5 and the gate electrode of the sixth transistor T6.

After forming the gate conductor including the gate electrode 1151 of the first transistor T1, the gate electrode 4151 of the fourth transistor T4, and the gate electrode 7151 of the seventh transistor T7, a doping process or plasma treatment may be performed. Part of the semiconductor layer covered by (overlapped by or overlapping) the gate conductor is not doped or plasma-treated, and the part of the semiconductor layer that is not covered by the gate conductor is doped or plasma-treated, thereby having the same characteristic as a conductor. Accordingly, the first region and the second region of the first to seventh transistors T1, T2, T3, T4, T5, T6, and T7 of each semiconductor layer may become a first electrode and a second electrode. In this case, the doping process may be performed with a p-type dopant, and the first transistor T1, the second transistor T2, the third transistor T3, the fourth transistor T4, the fifth transistor T5, the sixth transistor T6, and the seventh transistor T7 may have a p-type transistor characteristic.

An interlayer insulating layer 160 may be positioned on the gate conductor including the gate electrode 1151 of the first transistor T1, the gate electrode 4151 of the fourth transistor T4, and the gate electrode 7151 of the seventh transistor T7. The interlayer insulating layer 160 may have a single-layer or a multi-layered structure. The interlayer insulating layer 160 may include an inorganic insulating material or an organic insulating material.

A data conductor including a first initialization voltage line 127 and a second initialization voltage line 128 may be positioned on the interlayer insulating layer 160. FIG. 8 illustrates the semiconductor layer, the gate conductor, and the data conductor together. The data conductor may have a single-layer or a multi-layered structure. The data conductor may include at least one of aluminum (A1), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu).

The first initialization voltage line 127 and the second initialization voltage line 128 may extend in a direction parallel to each other. The first initialization voltage line 127 and the second initialization voltage line 128 may extend in the second direction DR2. In this case, the second direction DR2 may be a column direction. The first initialization voltage line 127 and the second initialization voltage line 128 may not extend in the first direction DR1. As the first initialization voltage line 127 and the second initialization voltage line 128 are extended in only a direction, an area occupied thereby in the display area DA is relatively reduced, so that the aperture ratio of the display device according to an embodiment may be improved.

The first initialization voltage line 127 may run from an end to another end on the substrate 110 in a plan view. For example, the first initialization voltage line 127 may run from an upper end to a lower end on the substrate 110 in a plan view. The pixels adjacent to each other in the second direction DR2 may be electrically connected to a same first initialization voltage line 127. The first initialization voltage line 127 is electrically connected to the first region 4131 of the fourth transistor T4, and may transmit the first initialization voltage VINT1. The interlayer insulating layer 160 may include an opening 163 overlapping the first region 4131 of the fourth transistor T4 and the first initialization voltage line 127. In this case, the opening 163 may also be formed in the gate insulating layer 140. The first initialization voltage line 127 may be electrically connected to the first region 4131 of the fourth transistor T4 through the opening 163.

The second initialization voltage line 128 may run from an end to another end on the substrate 110 in a plan view. For example, the second initialization voltage line 128 may run from an upper end to a lower end on the substrate 110 in a plan view. The pixels adjacent to each other in the second direction DR2 may be electrically connected to a same second initialization voltage line 128. The second initialization voltage line 128 is electrically connected to the second region 7133 of the seventh transistor T7, and may transmit the second initialization voltage VINT2. The interlayer insulating layer 160 may include an opening 161 that overlaps the second region 7133 of the seventh transistor T7 and the second initialization voltage line 128. In this case, the opening 161 may also be formed in the gate insulating layer 140. The second initialization voltage line 128 may be electrically connected to the second region 7133 of the seventh transistor T7 through the opening 161. Two pixels positioned on both sides of the second initialization voltage line 128 in a plan view may have planar structures symmetrical to each other.

The data conductor may further include a data line 171, a driving voltage line 172, a first connection electrode 175, and a second connection electrode 176.

The data line 171 and the driving voltage line 172 may extend in a direction parallel to each other. The data line 171 and the driving voltage line 172 may extend in the second direction DR2. Accordingly, the data line 171 and the driving voltage line 172 may extend in parallel to the first initialization voltage line 127 and the second initialization voltage line 128.

The data line 171 may run from an end to another end on the substrate 110 in a plan view. For example, the data line 171 may run from an upper end to a lower end on the substrate 110 in a plan view. The pixels adjacent to each other in the second direction DR2 may be electrically connected to a same data line 171. The data line 171 may be electrically connected to the first region of the second transistor T2 and may transmit the data signal Dm.

The driving voltage line 172 may run from an end to another end on the substrate 110 in a plan view. For example, the driving voltage line 172 may run from an upper end to a lower end of the substrate 110 in a plan view. The pixels adjacent to each other in the second direction DR2 may be electrically connected to a same driving voltage line 172. The driving voltage line 172 may be electrically connected to the first region of the fifth transistor T5 and may transmit the driving voltage ELVDD. The driving voltage lines 172 adjacent to each other in the first direction DR1 may be electrically connected to each other. In this case, the adjacent driving voltage lines 172 may be electrically connected to each other by a separate electrode pattern positioned on a different layer from the driving voltage line 172. The driving voltage line 172 may overlap the gate electrode 1151 of the first transistor T1 to form the storage capacitor Cst. An interlayer insulating layer 160 may be positioned between the driving voltage line 172 and the gate electrode 1151 of the first transistor T1. The driving voltage line 172 may be a first storage electrode of the storage capacitor Cst, and the gate electrode 1151 of the first transistor T1 may be a second storage electrode of the storage capacitor Cst.

The first connection electrode 175 may electrically connect the first transistor T1, the third transistor T3, and the fourth transistor T4 to each other. A first end (or one end) of the first connection electrode 175 may overlap the gate electrode 1151 of the first transistor T1. The interlayer insulating layer 160 may include an opening 165 overlapping the first connection electrode 175 and the gate electrode 1151 of the first transistor T1. The first connection electrode 175 may be electrically connected to the gate electrode 1151 of the first transistor T1 through the opening 165. A second end (or another end) of the first connection electrode 175 may overlap the second region 4133 of the fourth transistor T4. The interlayer insulating layer 160 may include an opening 164 overlapping the first connection electrode 175 and the second region 4133 of the fourth transistor T4. In this case, the opening 164 may also be formed in the gate insulating layer 140. The first connection electrode 175 may be electrically connected to the second region 4133 of the fourth transistor T4 through the opening 164. Since the second region 4133 of the fourth transistor T4 is electrically connected to the second region of the third transistor T3, the second region of the third transistor T3 may be electrically connected to the first connection electrode 175. Accordingly, the gate electrode 1151 of the first transistor T1 may be electrically connected to the second region 4133 of the fourth transistor T4 and the second region of the third transistor T3 by the first connection electrode 175.

The second connection electrode 176 may overlap the first region 7131 of the seventh transistor T7. The interlayer insulating layer 160 may include an opening 162 overlapping the second connection electrode 176 and the first region 7131 of the seventh transistor T7. In this case, the opening 162 may also be formed in the gate insulating layer 140. The second connection electrode 176 may be electrically connected to the first region 7131 of the seventh transistor T7 through the opening 162. Since the first region 7131 of the seventh transistor T7 is electrically connected to the second region of the sixth transistor T6, the second region of the sixth transistor T6 may be electrically connected to the second connection electrode 176.

A passivation layer 180 may be positioned over the data conductor including the first initialization voltage line 127 and the second initialization voltage line 128. The passivation layer 180 may include an organic insulating material such as a general-purpose polymer such as polymethyl methacrylate (PMMA) or polystyrene (PS), a polymer derivative having a phenolic group, an acryl-based polymer, an imide-based polymer, a polyimide, an acryl-based polymer, and a siloxane polymer.

A pixel electrode 191 may be positioned on the passivation layer 180. The passivation layer 180 may include an opening 181 overlapping the pixel electrode 191 and the second connection electrode 176. The pixel electrode 191 may be electrically connected to the second connection electrode 176 through the opening 181. The pixel electrode 191 may be electrically connected to the first region 7131 of the seventh transistor T7 and the second region of the sixth transistor T6 through the second connection electrode 176.

A partition wall 350 may be positioned on the pixel electrode 191. A pixel opening 351 is formed in the partition wall 350, and the pixel opening 351 of the partition wall 350 may overlap the pixel electrode 191. The partition wall 350 may include an organic insulating material such as a general-purpose polymer such as polymethyl methacrylate (PMMA) or polystyrene (PS), a polymer derivative having a phenolic group, an acryl-based polymer, an imide-based polymer, a polyimide, an acryl-based polymer, and a siloxane polymer.

A light-emitting element layer 370 may be positioned within the pixel opening 351 of the partition wall 350. The light-emitting element layer 370 may overlap the pixel electrode 191. The light-emitting element layer 370 may include an emission layer and an organic functional layer. The emission layer may include an organic material and/or an inorganic material. The organic functional layer may include a hole injection layer (HIL), a hole transporting layer (HTL), an electron transporting layer (ETL), an electron injection layer (EIL), etc. The light-emitting element layer 370 may generate colored light.

A common electrode 270 may be positioned on the light-emitting element layer 370 and the partition wall 350. The common electrode 270 may include reflective metals including calcium (Ca), barium (Ba), magnesium (Mg), aluminum (A1), silver (Ag), platinum (Pt), palladium (Pd), gold (Au), nickel (Ni), neodymium (Nd), iridium (Ir), chromium (Cr), lithium (Li), calcium (Ca), etc. or transparent conductive oxides (TCO) such as indium tin oxide (ITO) and indium zinc oxide (IZO).

The pixel electrode 191, the light-emitting element layer 370, and the common electrode 270 may form (or constitute) the light-emitting diode LED, and the pixel electrode 191 may be an anode, which is a hole injection electrode, and the common electrode 270 may be a cathode, which is an electron injection electrode. However, the disclosure is not limited thereto, and the anode and the cathode may be reversed according to the driving method of the display device.

Holes and electrons are injected into the light-emitting element layer 370 from the pixel electrode 191 and the common electrode 270, respectively, and light is emitted in case that excitons that are a combination of the injected holes and electrons fall from an excited state to a ground state.

Although not shown in the drawings, an encapsulation layer may be further positioned on the common electrode 270. The encapsulation layer may cover and seal not only the upper surface of the light-emitting diode LED, but also the side surfaces thereof. Since the light-emitting diode LED is vulnerable to moisture and oxygen, the encapsulation layer may seal the light-emitting diode LED to block the inflow of external moisture and oxygen.

Hereinafter, a connection structure of wiring positioned in the peripheral area of the display device and wiring positioned in the display area according to an embodiment will be further described with reference to FIGS. 9 to 11.

Figure 9:
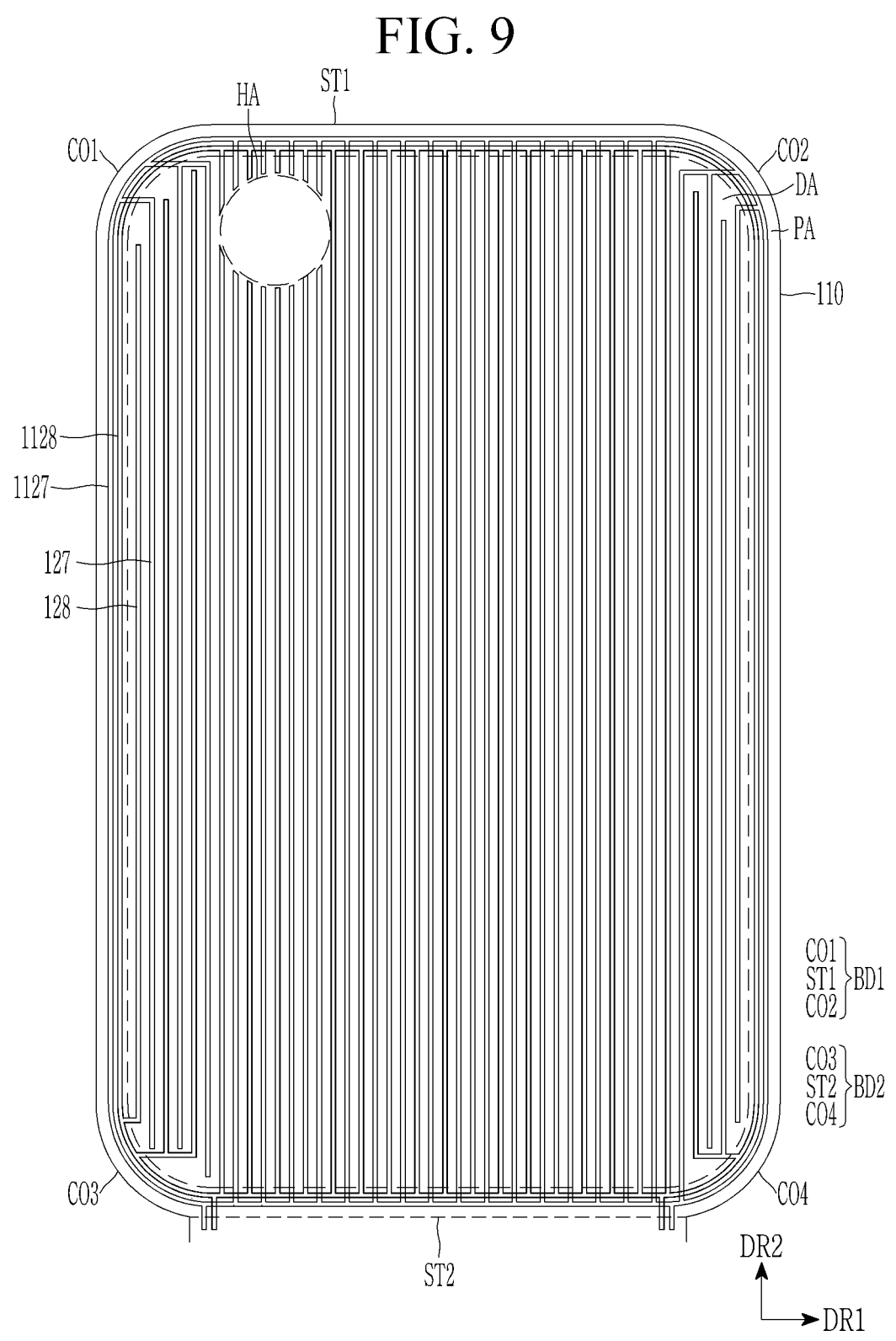
Figure 10:
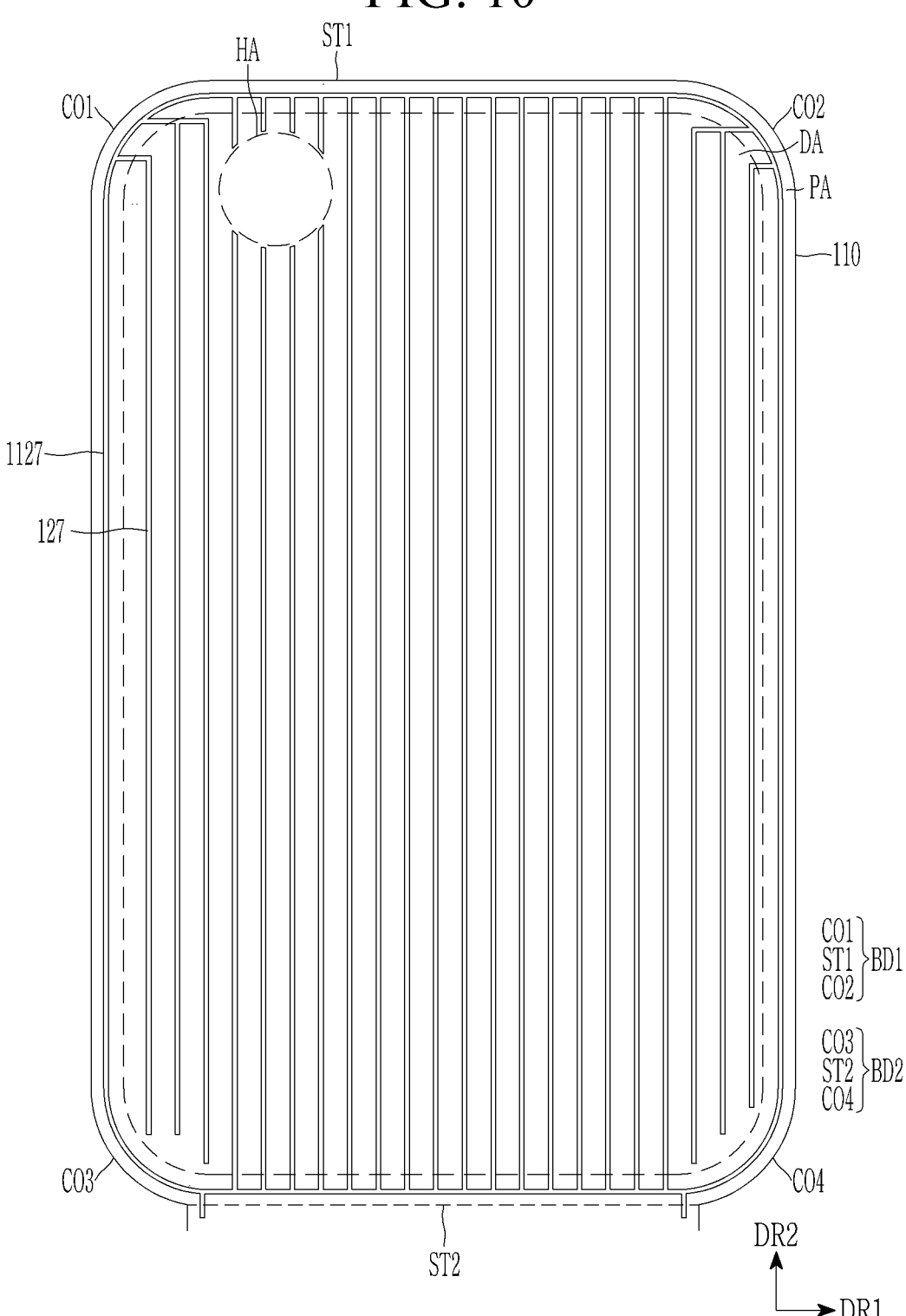
FIG. 10 and FIG. 11 are schematic plan views showing a part of FIG. 9.
Figure 11:
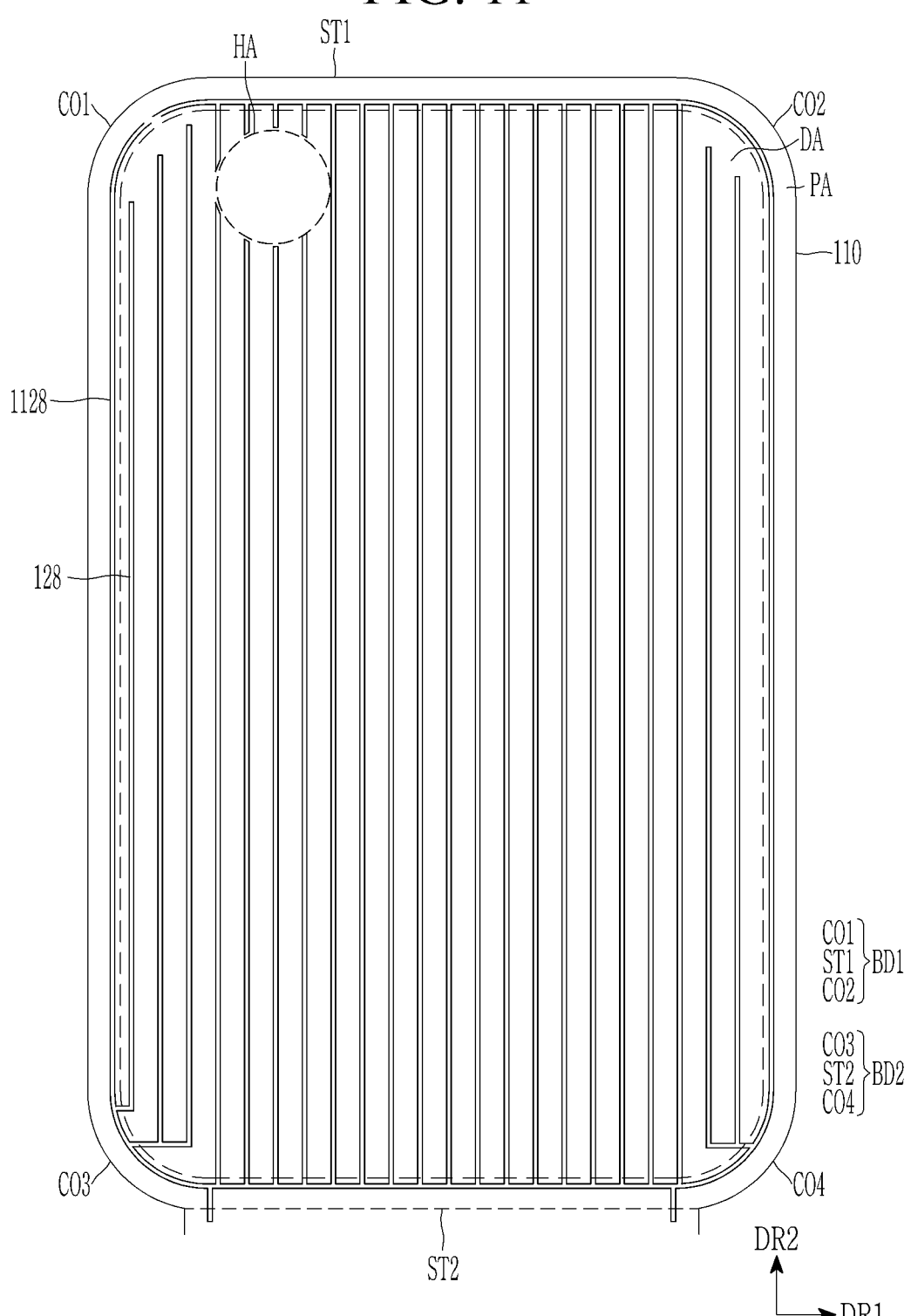

FIG. 9 is a schematic plan view illustrating some elements of a display device according to an embodiment, and FIGS. 10 and 11 are schematic plan views illustrating a part of FIG. 9. FIG. 10 illustrates the first initialization voltage line and the wiring electrically connected thereto in the display device according to an embodiment, and FIG. 11 illustrates the second initialization voltage line and the wiring electrically connected thereto in the display device according to an embodiment. FIG. 9 is a drawing illustrating FIGS. 10 and 11 together.

As shown in FIGS. 9 to 11, the display device according to an embodiment includes the first initialization voltage line 127 and the second initialization voltage line 128 positioned on the display area DA of the substrate 110. Also, the display device according to an embodiment further includes a first initialization voltage transmission line 1127 and a second initialization voltage transmission line 1128 positioned on the peripheral area PA of the substrate 110. As described above, the display device according to an embodiment may further include several wires such as the data line, the driving voltage line, the scan line, and the light emission control line in addition to the first initialization voltage line 127 and the second initialization voltage line 128, and the illustration of these wires is omitted from FIGS. 9 to 11. Also, although not illustrated in the drawings, a voltage transmission line for these wires may be further positioned on the peripheral area PA of the substrate 110.

The display device according to an embodiment may include first initialization voltage lines 127, and the first initialization voltage lines 127 may extend in a direction parallel to each other. First initialization voltage lines 127 may extend in the second direction DR2. The first initialization voltage VINT1 may be applied to first initialization voltage lines 127.

The display device according to an embodiment may include second initialization voltage lines 128, and the second initialization voltage lines 128 may extend in parallel to each other. Second initialization voltage lines 128 may extend in the second direction DR2. The second initialization voltage VINT2 may be applied to second initialization voltage lines 128.

The first initialization voltage line 127 and the second initialization voltage line 128 may be alternately disposed. For example, the second initialization voltage line 128 may be positioned on the left edge of the substrate 110, and the first initialization voltage line 127 may be positioned adjacent to the right side of the second initialization voltage line 128. Subsequently, the second initialization voltage line 128 and the first initialization voltage line 127 may be sequentially and repeatedly disposed.

A hole area HA may be positioned within the display area DA. The hole area HA may be approximately circular, and may be positioned on the upper left side of the substrate 110. However, this is not an example, and the shape and position of the hole area HA may be variously changed. A camera, a proximity sensor, an illuminance sensor, a gesture sensor, a motion sensor, a fingerprint recognition sensor, and a biometric sensor may be positioned in the hole area HA.

The first initialization voltage line 127 and the second initialization voltage line 128 may not be positioned in the hole area HA. In this case, the first initialization voltage line 127 positioned above the hole area HA and the first initialization voltage line 127 positioned below the hole area HA may not be electrically connected to each other. Similarly, the second initialization voltage line 128 positioned above the hole area HA and the second initialization voltage line 128 positioned below the hole area HA may not be electrically connected to each other.

The first initialization voltage transmission line 1127 may have a shape surrounding the display area DA in a plan view. The first initialization voltage transmission line 1127 may have a closed ring shape to completely surround the display area DA in a plan view. However, the disclosure is not limited thereto, and the first initialization voltage transmission line 1127 may be electrically disconnected in at least some regions. For example, the first initialization voltage transmission line 1127 may have an opened ring shape.

The first initialization voltage transmission line 1127 may be electrically connected to first initialization voltage lines 127. The first initialization voltage transmission line 1127 and the first initialization voltage line 127 may be electrically connected at a first edge BD1 or a second edge BD2 of the substrate 110. The first edge BD1 and the second edge BD2 may face each other. For example, the first edge BD1 may be an upper edge, and the second edge BD2 may be a lower edge. The substrate 110 may be approximately polygonal, and each corner of the polygon may have a rounded shape. The first edge BD1 may include a first corner part CO1, and a second corner part CO2 and a first straight-line part ST1 positioned between the first corner part CO1 and the second corner part CO2. The second edge BD2 may include a third corner part CO3, and a fourth corner part CO4 and a second straight-line part ST2 positioned between the third corner part CO3 and the fourth corner part CO4.

The first initialization voltage transmission line 1127 and the first initialization voltage line 127 may be electrically connected to each other in the first corner part CO1, the second corner part CO2, and the first straight-line part ST1 of the first edge BD1. Also, the first initialization voltage transmission line 1127 and the first initialization voltage line 127 may be electrically connected to each other in the second straight-line part ST2 of the second edge BD2. The first initialization voltage transmission line 1127 and the first initialization voltage line 127 may not be electrically connected to each other, but may be separated from each other, at the third corner part CO3 and the fourth corner part CO4 of the second edge BD2.

The second initialization voltage transmission line 1128 may have a shape surrounding the display area DA in a plan view. The second initialization voltage transmission line 1128 may have a closed ring shape to completely surround the display area DA in a plan view. However, the disclosure is not limited thereto, and the second initialization voltage transmission line 1128 may be electrically disconnected in at least some regions. For example, the second initialization voltage transmission line 1128 may have an opened ring shape. The second initialization voltage transmission line 1128 may be positioned inside the first initialization voltage transmission line 1127. For example, the second initialization voltage transmission line 1128 may be formed to surround the first initialization voltage transmission line 1127.

The second initialization voltage transmission line 1128 may be electrically connected to second initialization voltage lines 128. The second initialization voltage transmission line 1128 and the second initialization voltage line 128 may be electrically connected to each other at the first edge BD1 or the second edge BD2 of the substrate 110. The second initialization voltage transmission line 1128 and the second initialization voltage line 128 may be electrically connected to each other in the third corner part CO3, the fourth corner part CO4, and the second straight-line part ST2 of the second edge BD2. Also, the second initialization voltage transmission line 1128 and the second initialization voltage line 128 may be electrically connected to each other in the first straight-line part ST1 of the first edge BD1. The second initialization voltage transmission line 1128 and the second initialization voltage line 128 may not be electrically connected to each other, but may be separated from each other at the first corner part CO1 and the second corner part CO2 of the first edge BD1.

Hereinafter, the connection structure of each wire in the first edge BD1 and the second edge BD2 will be further described with reference to FIGS. 12 to 15.

Figure 12:
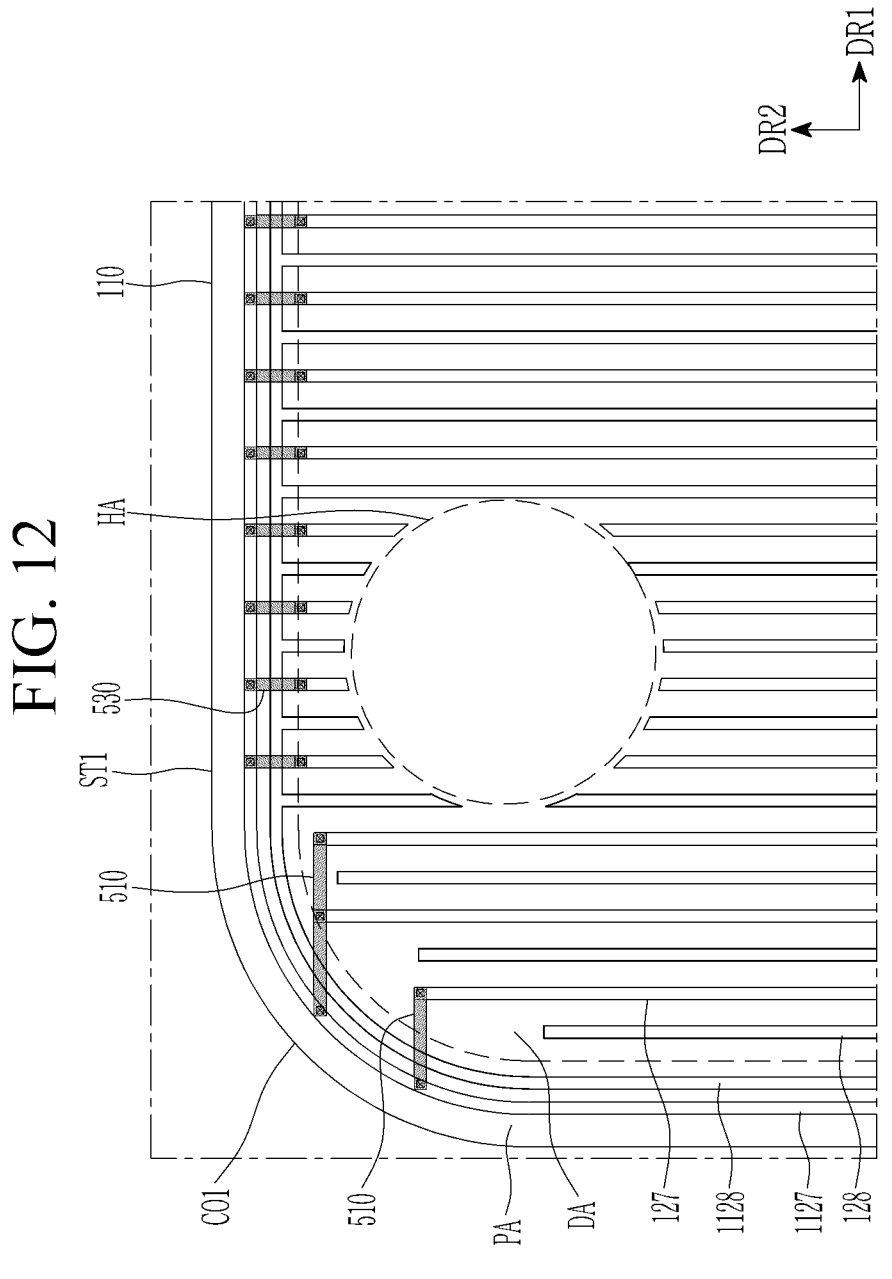
FIG. 12 to FIG. 15 are schematic plan views showing some region of a display device according to an embodiment.
Figure 13:
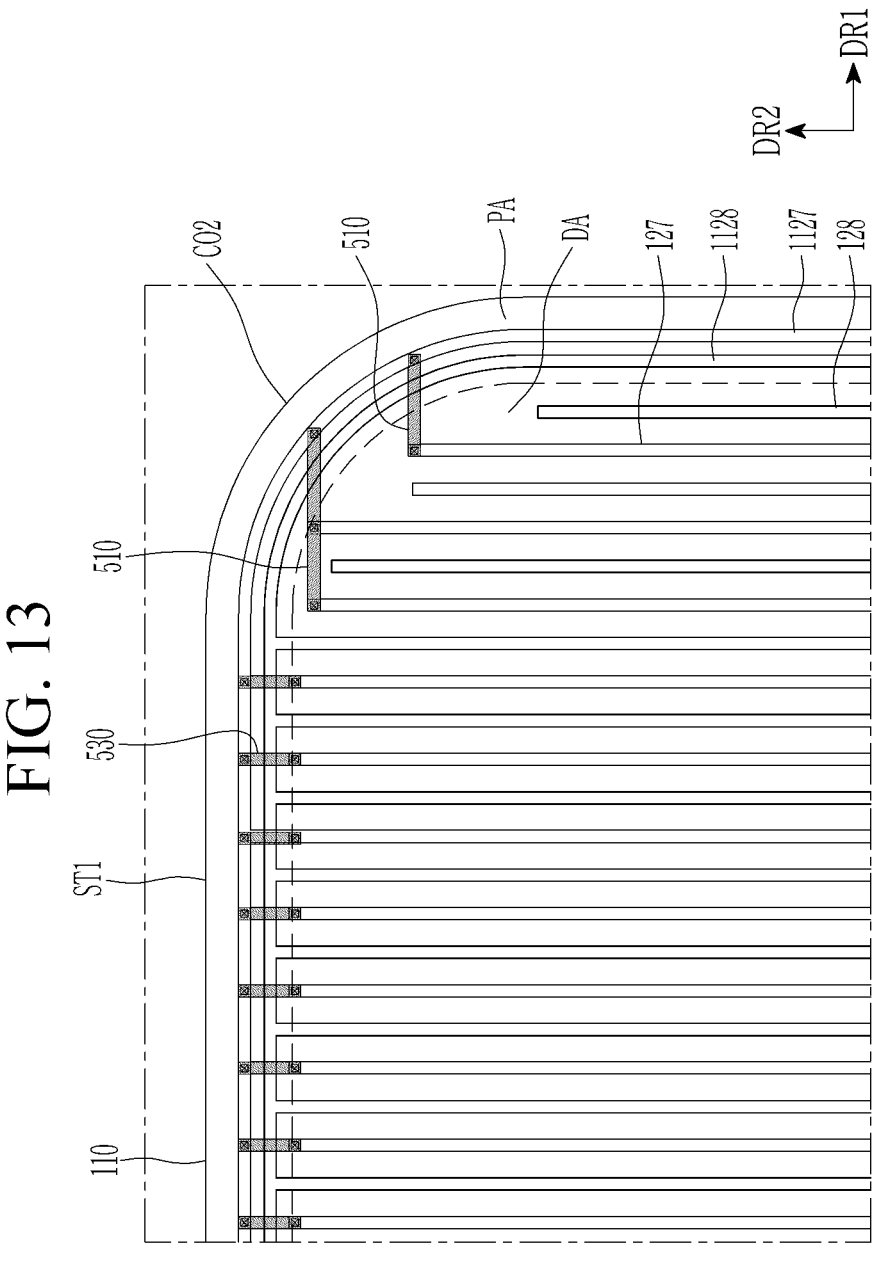
Figure 14:
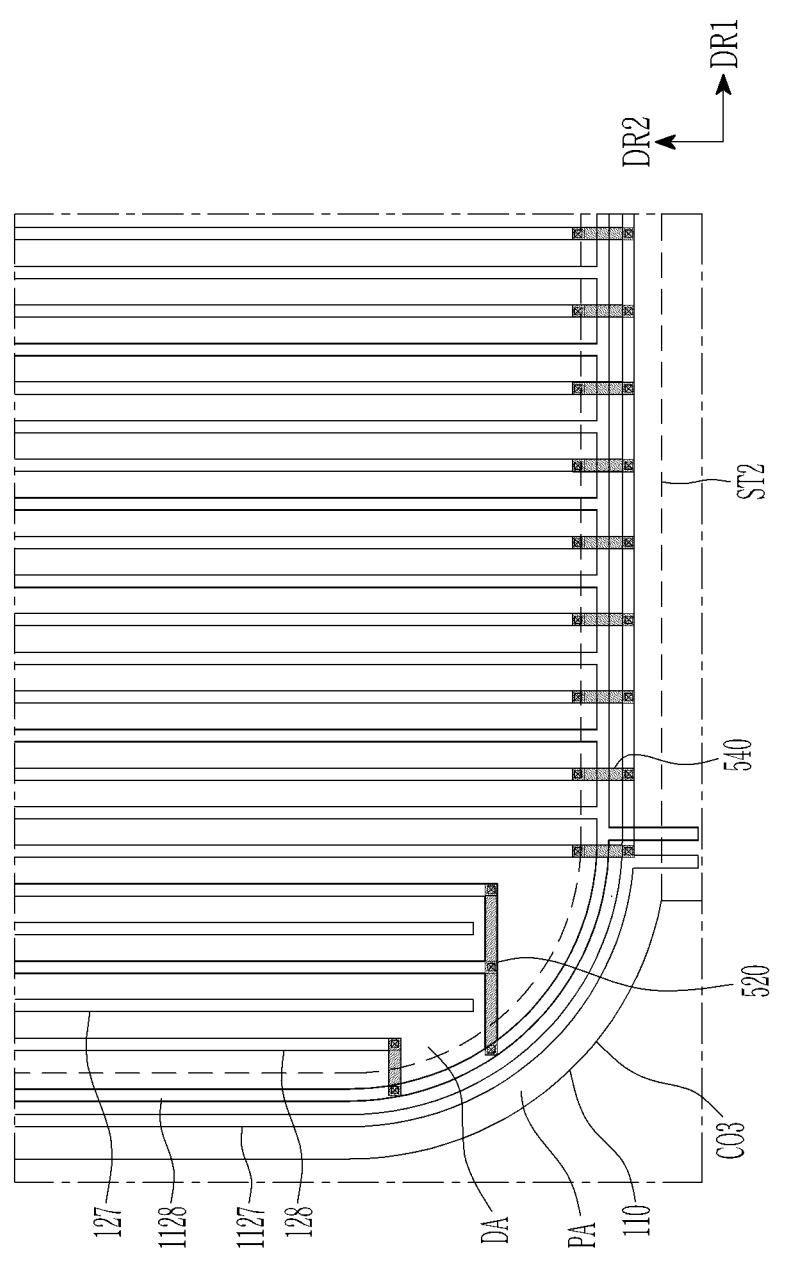
Figure 15:
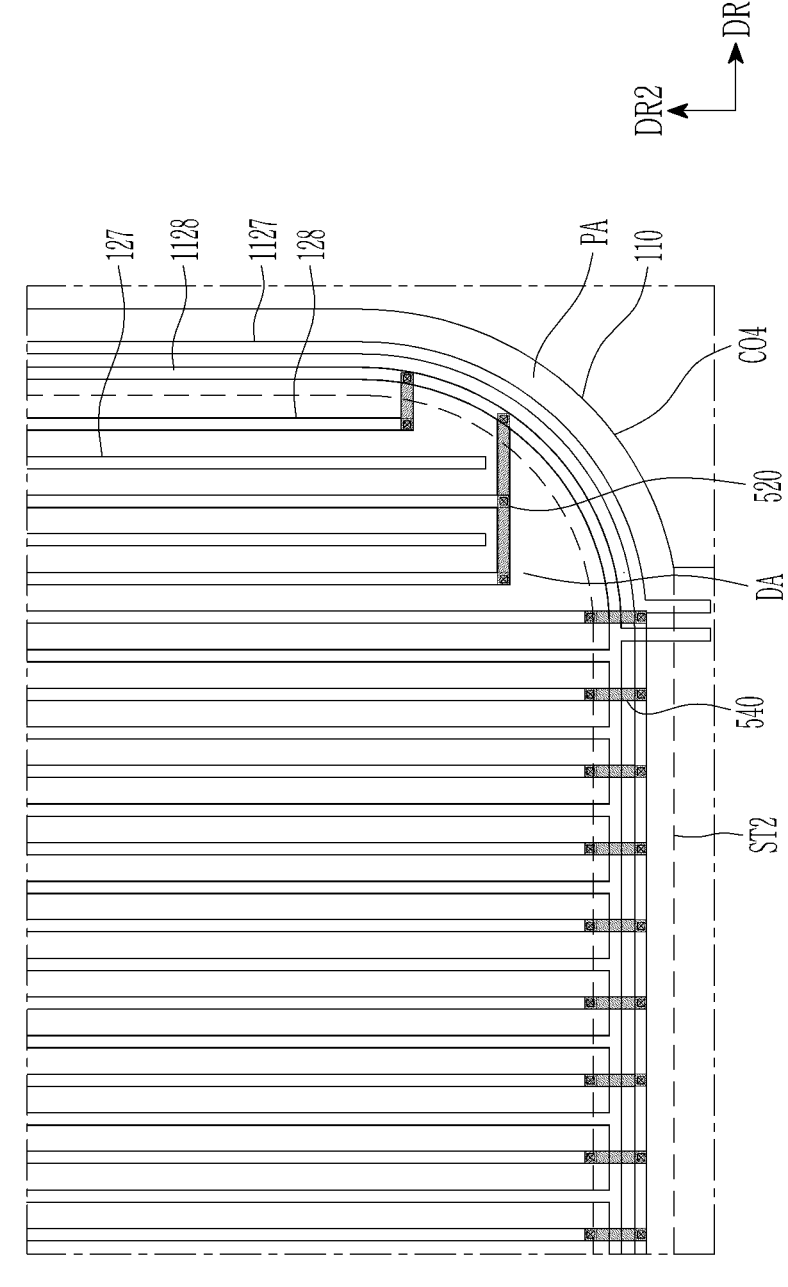

FIGS. 12 to 15 are schematic plan views illustrating some regions of a display device according to an embodiment. FIG. 12 illustrates the first corner part, the first straight-line part, and the surroundings thereof positioned on the upper left side of the display device according to an embodiment, and FIG. 13 illustrates the second corner part, the first straight-line part, and the surroundings thereof positioned on the upper right side of the display device according to an embodiment. FIG. 14 illustrates the third corner part, the second straight-line part, and the surroundings thereof positioned on the lower left side of the display device according to an embodiment, and FIG. 15 illustrates the fourth corner part, the second straight-line part, and the surroundings thereof positioned on the lower right side of the display device according to an embodiment.

As shown in FIGS. 12 to 15, a first bridge electrode 510, a second bridge electrode 520, a third bridge electrode 530, and a fourth bridge electrode 540 may be positioned between the display area DA and the peripheral area PA of the substrate 110. The first bridge electrode 510 and the second bridge electrode 520 may be positioned in the corner part and may be extended in the first direction DR1. The third bridge electrode 530 and the fourth bridge electrode 540 may be positioned in the straight-line part, and may be extended in the second direction DR2.

In the first corner part CO1 and the second corner part CO2 of the first edge BD1 of the substrate 110, the first initialization voltage transmission line 1127 and the first initialization voltage line 127 may be electrically connected to each other by the first bridge electrode 510. The first bridge electrode 510 may have a bar shape extending in the first direction DR1. A first end (or one end) of the first bridge electrode 510 may be electrically connected to the first initialization voltage transmission line 1127, and a second end (or another end) of the first bridge electrode 510 may be electrically connected to the first initialization voltage line 127. The first bridge electrode 510 may be electrically connected to a first initialization voltage line 127 or first initialization voltage lines 127. For example, the first bridge electrode 510 may be electrically connected to two first initialization voltage lines 127. However, this is only an example, and the number of the first initialization voltage lines 127 electrically connected to the first bridge electrode 510 may be variously changed. The first bridge electrode 510 may be positioned in the first corner part CO1 and the second corner part CO2 of the first edge BD1 of the substrate 110, and may not be positioned in the third corner part CO3 and the fourth corner part CO4 of the second edge BD2. Accordingly, the first initialization voltage transmission line 1127 and the first initialization voltage line 127 may not be electrically connected to each other, but may be separated in the third corner part CO3 and the fourth corner part CO4 of the second edge BD2.

In the third corner part CO3 and the fourth corner part CO4 of the second edge BD2 of the substrate 110, the second initialization voltage transmission line 1128 and the second initialization voltage line 128 may be electrically connected to each other by the second bridge electrode 520. The second bridge electrode 520 may have a bar shape extending in the first direction DR1. A first end of the second bridge electrode 520 may be electrically connected to the second initialization voltage transmission line 1128, and a second end of the second bridge electrode 520 may be electrically connected to the second initialization voltage line 128. The second bridge electrode 520 may be electrically connected to a second initialization voltage line 128 or second initialization voltage lines 128. For example, the second bridge electrode 520 may be electrically connected to two second initialization voltage lines 128. However, this is only an example, and the number of the second initialization voltage lines 128 electrically connected to the second bridge electrode 520 may be variously changed. The second bridge electrode 520 may be positioned on the third corner part CO3 and the fourth corner part CO4 of the second edge BD2 of the substrate 110, and may not be positioned on the first corner part CO1 and the second corner part CO2 of the first edge BD1. Accordingly, the second initialization voltage transmission line 1128 and the second initialization voltage line 128 may not be electrically connected to each other, but may be separated from each other in the first corner part CO1 and the second corner part CO2 of the first edge BD1.

In the first straight-line part ST1 of the first edge BD1 of the substrate 110, the first initialization voltage transmission line 1127 and the first initialization voltage line 127 may be electrically connected to each other by the third bridge electrode 530. The third bridge electrode 530 may have a rod shape (or bar shape) extending in the second direction DR2. A first end of the third bridge electrode 530 may be electrically connected to the first initialization voltage transmission line 1127, and a second end of the third bridge electrode 530 may be electrically connected to the first initialization voltage line 127.

In the second straight-line part ST2 of the second edge BD2 of the substrate 110, the first initialization voltage transmission line 1127 and the first initialization voltage line 127 may be electrically connected to each other by the fourth bridge electrode 540. The fourth bridge electrode 540 may have a rod shape extending in the second direction DR2. A first end of the fourth bridge electrode 540 may be electrically connected to the first initialization voltage transmission line 1127, and a second end of the fourth bridge electrode 540 may be electrically connected to the first initialization voltage line 127.

In the first straight-line part ST1 of the first edge BD1 and the second straight-line part ST2 of the second edge BD2 of the substrate 110, the second initialization voltage transmission line 1128 and the second initialization voltage line 128 may be directly connected to each other. For example, in the straight-line part, the second initialization voltage transmission line 1128 and the second initialization voltage line 128 may be electrically connected to each other without using a separate bridge electrode.

In the corner part having the rounded shape, the connection structure between the wiring positioned in the display area DA and the wiring positioned in the peripheral area PA may be complicated. In the display device according to an embodiment, the first initialization voltage transmission line 1127 and the first initialization voltage line 127 are electrically connected to each other in only the first corner part CO1 and the second corner part CO2 of the first edge BD1, and are not electrically connected to each other in the third corner part CO3 and the fourth corner part CO4 of the second edge BD2. The display device according to an embodiment may have the connection structure of the wiring more advantageous than (e.g., more streamlined or simpler than) the structure in which the first initialization voltage transmission line 1127 and the first initialization voltage line 127 are electrically connected to each other in all corner parts. In addition, in the display device according to an embodiment, the second initialization voltage transmission line 1128 and the second initialization voltage line 128 are electrically connected to each other in only the third corner part CO3 and the fourth corner part CO4 of the second edge BD2, and are not electrically connected to each other in the first corner part CO1 and the second corner part CO2 of the first edge BD1. The display device according to an embodiment may have the wiring connection structure more advantageous than (e.g., more streamlined or simpler than) the structure in which the second initialization voltage transmission line 1128 and the second initialization voltage line 128 are electrically connected to each other in all corner parts. Accordingly, by simplifying the wiring connection structure in the display device according to an embodiment, the region where an image is not displayed may be reduced.

In the display device according to an embodiment, the first initialization voltage transmission line 1127 and the first initialization voltage line 127 are electrically connected to in the first straight-line part ST1 of the first edge BD1 and the second straight-line part ST2 of the second edge BD2. For example, since the first initialization voltage transmission line 1127 is electrically connected to ends of the first initialization voltage line 127, respectively, a drop in the voltage applied to the first initialization voltage line 127 may be prevented. In addition, the second initialization voltage transmission line 1128 and the second initialization voltage line 128 are electrically connected to each other in the first straight-line part ST1 of the first edge BD1 and the second straight-line part ST2 of the second edge BD2. For example, since the second initialization voltage transmission line 1128 is electrically connected to ends of the second initialization voltage line 128, respectively, a drop in the voltage applied to the second initialization voltage line 128 may be prevented.

Hereinafter, the interlayer structure of each wire is further described further with reference to FIGS. 16 to 19.

Figure 16:
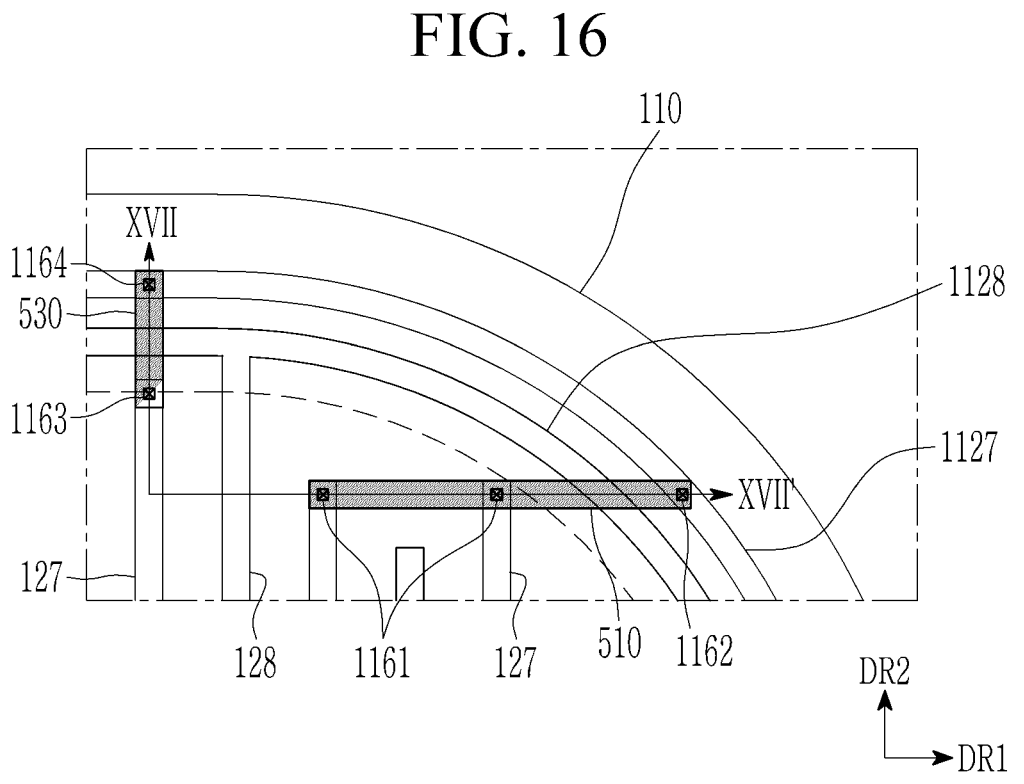
Figure 17:
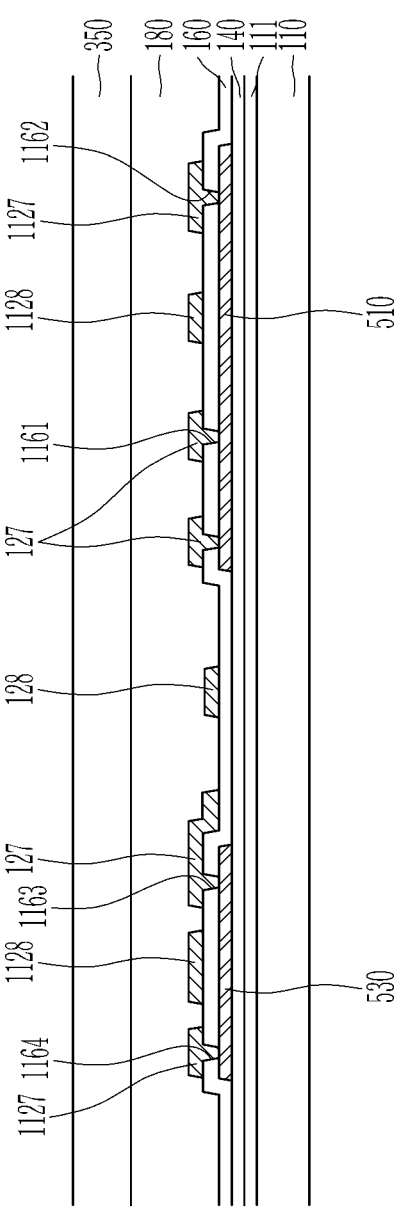
FIG. 17 is a schematic cross-sectional view taken along line XVII-XVII' of FIG. 16.
Figure 18:
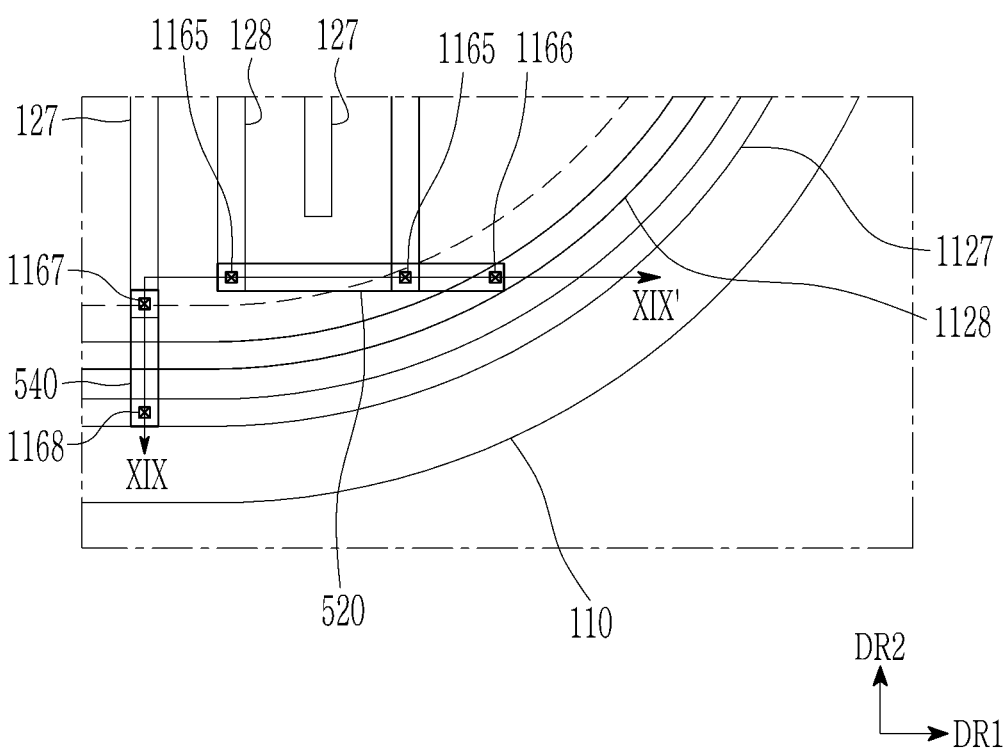
FIG. 18 is a schematic enlarged plan view of some region of FIG. 15.
Figure 19:
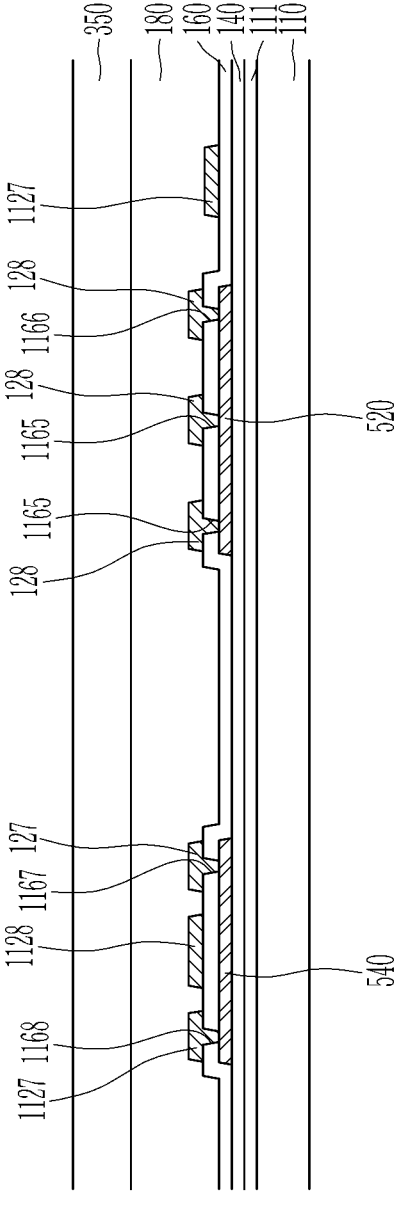
FIG. 19 is a schematic cross-sectional view taken along line XIX-XIX' of FIG. 18.

FIG. 16 is a schematic enlarged plan view of a region of FIG. 13, and FIG. 17 is a schematic cross-sectional view taken along line XVII-XVII' of FIG. 16. FIG. 18 is a schematic enlarged plan view of a portion of FIG. 15, and FIG. 19 is a schematic cross-sectional view taken along line XIX-XIX' of FIG. 18.

As shown in FIGS. 16 to 19, a first bridge electrode 510, a second bridge electrode 520, a third bridge electrode 530, and a fourth bridge electrode 540 may be positioned on a substrate 110. The first to fourth bridge electrodes 510, 520, 530, and 540 may be positioned at a boundary between the display area DA and the peripheral area PA of the substrate 110. A part of the first to fourth bridge electrodes 510, 520, 530, and 540 may be positioned in the display area DA, and the remaining part may be positioned in the peripheral area PA. The first bridge electrode 510 and the second bridge electrode 520 may extend in the first direction DR1, and the third bridge electrode 530 and the fourth bridge electrode 540 may extend in the second direction DR2 perpendicular to the first direction DR1.

The first to fourth bridge electrodes 510, 520, 530, and 540 and the gate conductor may be positioned on a same layer. A buffer layer 111 and a gate insulating layer 140 may be positioned between the substrate 110 and the first to fourth bridge electrodes 510, 520, 530, and 540. An interlayer insulating layer 160 may be positioned on the first to fourth bridge electrodes 510, 520, 530, and 540.

A first initialization voltage line 127, a second initialization voltage line 128, a first initialization voltage transmission line 1127, and a second initialization voltage transmission line 1128 may be positioned on the interlayer insulating layer 160. The first initialization voltage line 127 and the second initialization voltage line 128 may be positioned on the display area DA of the substrate 110, and may extend in the second direction DR2. The first initialization voltage transmission line 1127 and the second initialization voltage transmission line 1128 may be positioned on the peripheral area PA of the substrate 110 and may have a shape surrounding the display area DA.

On the first corner part CO1 of the substrate 110, the first initialization voltage line 127 may overlap the first bridge electrode 510. The interlayer insulating layer 160 may include an opening 1161 overlapping the first initialization voltage line 127 and the first bridge electrode 510. The first initialization voltage line 127 may be electrically connected to the first bridge electrode 510 through the opening 1161. The first initialization voltage transmission line 1127 may overlap the first bridge electrode 510. The interlayer insulating layer 160 may include an opening 1162 overlapping the first initialization voltage transmission line 1127 and the first bridge electrode 510. The first initialization voltage transmission line 1127 may be electrically connected to the first bridge electrode 510 through the opening 1162. On the first corner part CO1 of the substrate 110, the first initialization voltage line 127 and the first initialization voltage transmission line 1127 may be electrically connected to each other by the first bridge electrode 510. Similarly, on the second corner part CO2 of the substrate 110, the first initialization voltage line 127 and the first initialization voltage transmission line 1127 may be electrically connected to each other by the first bridge electrode 510.

On the first straight-line part ST1 of the substrate 110, the first initialization voltage line 127 may overlap the third bridge electrode 530. The interlayer insulating layer 160 may include an opening 1163 overlapping the first initialization voltage line 127 and the third bridge electrode 530. The first initialization voltage line 127 may be electrically connected to the third bridge electrode 530 through the opening 1163. The first initialization voltage transmission line 1127 may overlap the third bridge electrode 530. The interlayer insulating layer 160 may include an opening 1164 overlapping the first initialization voltage transmission line 1127 and the third bridge electrode 530. The first initialization voltage transmission line 1127 may be electrically connected to the third bridge electrode 530 through the opening 1164. On the first straight-line part ST1 of the substrate 110, the first initialization voltage line 127 and the first initialization voltage transmission line 1127 may be electrically connected to each other by the third bridge electrode 530.

On the second straight-line part ST2 of the substrate 110, the first initialization voltage line 127 may overlap the fourth bridge electrode 540. The interlayer insulating layer 160 may include an opening 1167 overlapping the first initialization voltage line 127 and the fourth bridge electrode 540. The first initialization voltage line 127 may be electrically connected to the fourth bridge electrode 540 through the opening 1167. The first initialization voltage transmission line 1127 may overlap the fourth bridge electrode 540. The interlayer insulating layer 160 may include an opening 1168 overlapping the first initialization voltage transmission line 1127 and the fourth bridge electrode 540. The first initialization voltage transmission line 1127 may be electrically connected to the fourth bridge electrode 540 through the opening 1168. The first initialization voltage line 127 and the first initialization voltage transmission line 1127 on the second straight-line part ST2 of the substrate 110 may be electrically connected to each other by a fourth bridge electrode 540.

The second initialization voltage line 128 on the third corner part CO3 of the substrate 110 may overlap the second bridge electrode 520. The interlayer insulating layer 160 may include an opening 1165 overlapping the second initialization voltage line 128 and the second bridge electrode 520. The second initialization voltage line 128 may be electrically connected to the second bridge electrode 520 through the opening 1165. The second initialization voltage transmission line 1128 may overlap the second bridge electrode 520. The interlayer insulating layer 160 may include an opening 1166 overlapping the second initialization voltage transmission line 1128 and the second bridge electrode 520. The second initialization voltage transmission line 1128 may be electrically connected to the second bridge electrode 520 through the opening 1166. On the third corner part CO3 of the substrate 110, the second initialization voltage transmission line 1128 and the second initialization voltage line 128 may be electrically connected to each other by the second bridge electrode 520. Similarly, on the fourth corner part CO4 of the substrate 110, the second initialization voltage transmission line 1128 and the second initialization voltage line 128 may be electrically connected to each other by the second bridge electrode 520.

A passivation layer 180 may be positioned on the first initialization voltage line 127, the second initialization voltage line 128, the first initialization voltage transmission line 1127, and the second initialization voltage transmission line 1128. A partition wall 350 may be positioned on the passivation layer 180.

In the embodiment, the first initialization voltage line and the first initialization voltage transmission line are electrically connected to each other in the corner part of the first edge, and are not electrically connected to each other in the corner part of the second edge. Also, the second initialization voltage line and the second initialization voltage transmission line are electrically connected to each other in the corner part of the second edge, but are not electrically connected to each other in the corner part of the first edge. However, the display device according to an embodiment is not limited thereto, and the reverse may be possible. The first initialization voltage line and the first initialization voltage transmission line may be electrically connected to each other at the corner part of the second edge and not electrically connected to each other at the corner part of the first edge. Also, the second initialization voltage line and the second initialization voltage transmission line may be electrically connected to each other at the corner part of the first edge and not electrically connected to each other at the corner part of the second edge.

In the embodiment, it has been described that the second initialization voltage transmission line is positioned inside the first initialization voltage transmission line, but the disclosure is not limited thereto. Conversely, the second initialization voltage transmission line may be positioned outside the first initialization voltage transmission line. For example, the first initialization voltage transmission line may be positioned inside the second initialization voltage transmission line. In this case, in the straight-line part of the first edge and the second edge, the second initialization voltage transmission line and the second initialization voltage line may be electrically connected to each other by a bridge electrode. Also, in the straight-line part of the first edge and the second edge, the first initialization voltage transmission line and the first initialization voltage line may be directly connected to each other.

In the embodiment, the connection structure of the first initialization voltage line and the first initialization voltage transmission line and the connection structure of the second initialization voltage line and the second initialization voltage transmission line have been described, but the disclosure is not limited thereto. Instead of the first initialization voltage line and the first initialization voltage transmission line to which the first initialization voltage is applied, the first voltage line and the first voltage transmission line to which the first voltage is applied may be used. Similarly, instead of the second initialization voltage line and the second initialization voltage transmission line to which the second initialization voltage is applied, the second voltage line and the second voltage transmission line to which the second voltage is applied may be used. In this case, the first voltage and the second voltage may each be a constant voltage. The first voltage may be different from the second voltage.

The display device according to an embodiment is described with reference to FIG. 20 as follows.

The display device according to the embodiment shown in FIG. 20 is substantially the same as the display device according to the embodiment shown in FIGS. 1 to 19, so repetitive descriptions thereof are omitted. In the embodiment, the connection relationship in the straight-line part of the substrate is different from the previous embodiment, and is further described below.

Figure 21:
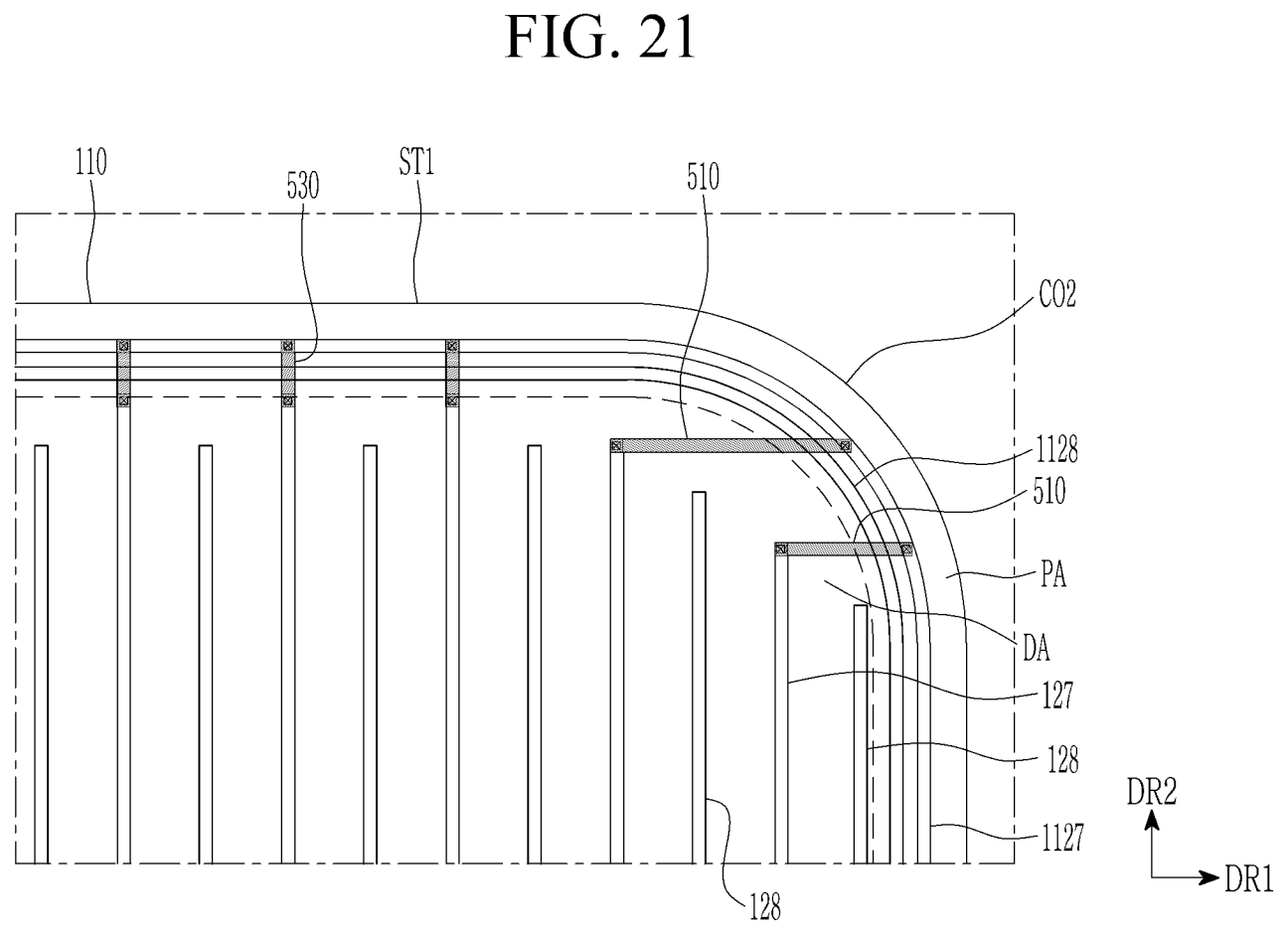
Figure 22:
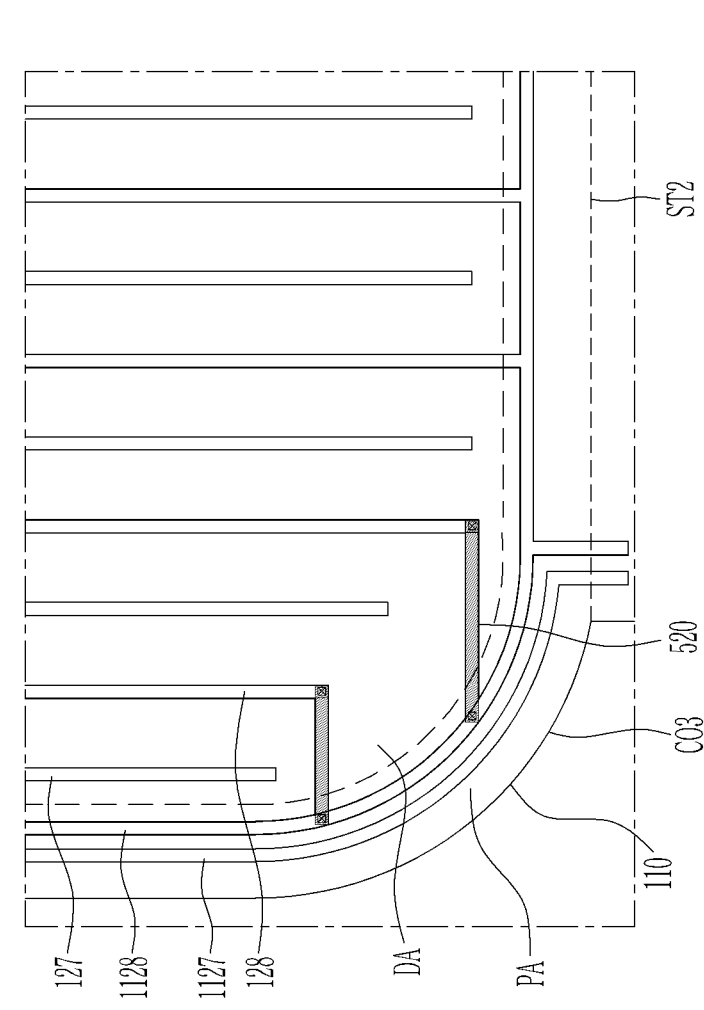

FIG. 20 is a schematic plan view illustrating some elements of a display device according to an embodiment, and FIGS. 21 and 22 are schematic plan views illustrating some regions of a display device according to an embodiment. FIG. 21 illustrates the second corner part, the first straight-line part, and the surroundings thereof positioned on the upper right side of the display device according to an embodiment, and FIG. 22 illustrates the third corner part, the second straight-line part, and the surroundings thereof positioned on the lower left side of the display device according to an embodiment.

As shown in FIGS. 20 to 22, the display device according to an embodiment includes a first initialization voltage line 127 and a second initialization voltage line 128 positioned on the display area DA of the substrate 110. In addition, the display device according to an embodiment further includes a first initialization voltage transmission line 1127 and a second initialization voltage transmission line 1128 positioned on the peripheral area PA of the substrate 110.

First initialization voltage lines 127 and second initialization voltage lines 128 may extend in the second direction DR2. The first initialization voltage VINT1 may be applied to first initialization voltage lines 127. The second initialization voltage VINT2 may be applied to second initialization voltage lines 128.

The first initialization voltage transmission line 1127 may have a shape surrounding the display area DA in a plan view. In this case, the first initialization voltage transmission line 1127 may be positioned adjacent to the left edge, the upper edge, and the right edge of the display area DA in a plan view, and may not be positioned adjacent to the lower edge thereof.

The first initialization voltage transmission line 1127 may be electrically connected to first initialization voltage lines 127. The first initialization voltage transmission line 1127 and the first initialization voltage line 127 may be electrically connected to each other at the first edge BD1 of the substrate 110. The first edge BD1 may be an upper edge. The first initialization voltage transmission line 1127 and the first initialization voltage line 127 may be electrically connected to each other in the first corner part CO1, the second corner part CO2, and the first straight-line part ST1 of the first edge BD1. The first initialization voltage transmission line 1127 and the first initialization voltage line 127 may not be electrically connected to each other, but may be separated from each other, in the third corner part CO3, the fourth corner part CO4, and the second straight-line part ST2 of the second edge BD2.

In the first corner part CO1 and the second corner part CO2 of the first edge BD1 of the substrate 110, the first initialization voltage transmission line 1127 and the first initialization voltage line 127 may be electrically connected to each other by the first bridge electrode 510. The first bridge electrode 510 may have a bar shape extending in the first direction DR1. A first end (or one end) of the first bridge electrode 510 may be electrically connected to the first initialization voltage transmission line 1127, and a second end (or anther end) of the first bridge electrode 510 may be electrically connected to the first initialization voltage line 127.

In the first straight-line part ST1 of the first edge BD1 of the substrate 110, the first initialization voltage transmission line 1127 and the first initialization voltage line 127 may be electrically connected to each other by the third bridge electrode 530. The third bridge electrode 530 may have a rod shape extending in the second direction DR2. A first end of the third bridge electrode 530 may be electrically connected to the first initialization voltage transmission line 1127, and a second end of the third bridge electrode 530 may be electrically connected to the first initialization voltage line 127.

In the second straight-line part ST2 of the second edge BD2 of the substrate 110, the first initialization voltage transmission line 1127 and the first initialization voltage line 127 may not be electrically connected to each other. The first initialization voltage transmission line 1127 may not be positioned in the second straight-line part ST2 of the second edge BD2 of the substrate 110.

The second initialization voltage transmission line 1128 may have a shape surrounding the display area DA in a plan view. The second initialization voltage transmission line 1128 may have a closed ring shape to completely surround the display area DA in a plan view. However, the disclosure is not limited thereto, and the second initialization voltage transmission line 1128 may be electrically disconnected in at least some regions. For example, the second initialization voltage transmission line 1128 may be positioned adjacent to the left edge, the lower edge, and the right edge of the display area DA in a plan view, and may not be positioned adjacent to the upper edge thereof.

The second initialization voltage transmission line 1128 may be electrically connected to second initialization voltage lines 128. The second initialization voltage transmission line 1128 and the second initialization voltage line 128 may be electrically connected to each other at the second edge BD2 of the substrate 110. The second edge BD2 may be the lower edge. The second initialization voltage transmission line 1128 and the second initialization voltage line 128 may be electrically connected to each other in the third corner part CO3, the fourth corner part CO4, and the second straight-line part ST2 of the second edge BD2. The second initialization voltage transmission line 1128 and the second initialization voltage line 128 may not be electrically connected to each other and may be separated from each other, in the first corner part CO1, the second corner part CO2, and the first straight-line part ST1 of the first edge BD1.

In the third corner part CO3 and the fourth corner part CO4 of the second edge BD2 of the substrate 110, the second initialization voltage transmission line 1128 and the second initialization voltage line 128 may be electrically connected to each other by a second bridge electrode 520. The second bridge electrode 520 may have a bar shape extending in the first direction DR1. A first end of the second bridge electrode 520 may be electrically connected to the second initialization voltage transmission line 1128, and a second end of the second bridge electrode 520 may be electrically connected to the second initialization voltage line 128.

In the second straight-line part ST2 of the second edge BD2 of the substrate 110, the second initialization voltage transmission line 1128 and the second initialization voltage line 128 may be directly connected to each other. For example, in the straight-line part, the second initialization voltage transmission line 1128 and the second initialization voltage line 128 may be electrically connected to each other without using a separate bridge electrode.

In the first straight-line part ST1 of the first edge BD1 of the substrate 110, the second initialization voltage transmission line 1128 and the second initialization voltage line 128 may not be electrically connected to each other. Although FIG. 21 illustrates that the second initialization voltage transmission line 1128 is positioned in the first straight-line part ST1 of the first edge BD1 of the substrate 110, the disclosure is not limited thereto, and the second initialization voltage voltage transmission line 1128 may not be positioned in the first straight-line part ST1 of the substrate 110.

In the display device according to an embodiment, the first initialization voltage transmission line 1127 and the first initialization voltage line 127 are electrically connected to each other in only the first corner part CO1, the second corner part CO2, and the first straight-line part ST1 of the first edge BD1, and are not electrically connected to each other in the third corner part CO3, the fourth corner part CO4, and the second straight-line part ST2 of the second edge BD2. The display device according to an embodiment may have the connection structure of the wiring more advantageous than (e.g., more streamlined or simpler than) the structure in which the first initialization voltage transmission line 1127 and the first initialization voltage line 127 are electrically connected to each other at both edges, and it is possible to reduce the region where an image is displayed. Also, it is possible to prevent a voltage difference between the wiring electrically connected to the corner part and the wiring electrically connected to the straight-line part.

In addition, in the display device according to an embodiment, the second initialization voltage transmission line 1128 and the second initialization voltage line 128 are electrically connected to each other in only the third corner part CO3, the fourth corner part CO4, and the second straight-line part ST2 of the second edge BD2, and are not electrically connected to each other in the first corner part CO1, the second corner part CO2, and the first straight-line part ST1 of the first edge BD1. The display device according to an embodiment may have the connection structure of the wiring more advantageous than (e.g., more streamlined or simpler than) the structure in which the second initialization voltage transmission line 1128 and the second initialization voltage line 128 are electrically connected to each other at both edges, and the region where an image is not displayed may be reduced. Also, it is possible to prevent a voltage difference between the wiring electrically connected to the corner part and the wiring electrically connected to the straight-line part.

In the embodiment, the first initialization voltage line and the first initialization voltage transmission line are electrically connected to each other at the first edge and not electrically connected to each other at the second edge. Also, the second initialization voltage line and the second initialization voltage transmission line are electrically connected to each other at the second edge and not electrically connected to each other at the first edge. However, the display device according to an embodiment is not limited thereto, and vice versa may be possible. The first initialization voltage line and the first initialization voltage transmission line may be electrically connected to each other at the second edge and not electrically connected to each other at the first edge. Also, the second initialization voltage line and the second initialization voltage transmission line may be electrically connected to each other at the first edge and not electrically connected to each other at the second edge.

In the embodiment, it has been described that the second initialization voltage transmission line is positioned inside the first initialization voltage transmission line, but conversely, the second initialization voltage transmission line may be positioned outside the first initialization voltage transmission line.

Although the connection structure of the first initialization voltage line and the first initialization voltage transmission line and the connection structure of the second initialization voltage line and the second initialization voltage transmission line have been described in the embodiment, it is not limited thereto, and may also be applied to the connection structure of the wires to which a different voltage is applied instead of the initialization voltage.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a substrate including a display area and a peripheral area;
a first voltage line disposed on the display area of the substrate, a first voltage being applied to the first voltage line;
a second voltage line disposed on the display area of the substrate and extending in a direction parallel to the first voltage line, a second voltage being applied to the second voltage line;
a first voltage transmission line disposed on the peripheral area of the substrate and surrounding the display area in a plan view, the first voltage transmission line transmitting the first voltage;
a second voltage transmission line disposed on the peripheral area of the substrate, the first voltage transmission line surrounding the second voltage transmission line in the plan view, the second voltage transmission line transmitting the second voltage, wherein a distance between the first voltage transmission line and the display area is larger than a distance between the second voltage transmission line and the display area;
a first bridge electrode disposed on a first edge of the substrate and electrically connecting the first voltage line and the first voltage transmission line; and
a second bridge electrode disposed on a second edge of the substrate and electrically connecting the second voltage line and the second voltage transmission line.

2. The display device of claim 1, wherein the first edge and the second edge face each other.

3. The display device of claim 1, wherein
the first voltage and the second voltage are constant, and
the first voltage is different from the second voltage.

4. The display device of claim 1, wherein
the substrate has a polygonal shape,
each corner part of the substrate has a rounded shape, and
the first bridge electrode and the second bridge electrode are disposed at the each corner part.

5. The display device of claim 4, wherein
the first bridge electrode and the second bridge electrode extend in a first direction, and
the first voltage line and the second voltage line extend in a second direction perpendicular to the first direction.

6. The display device of claim 5, wherein
the first edge of the substrate includes:
a first corner part;
a second corner part; and
a first straight-line part disposed between the first corner part and the second corner part;

the second edge of the substrate includes:
  a third corner part;
  a fourth corner part; and
  a second straight-line part disposed between the third
    corner part and the fourth corner part;
the first bridge electrode is disposed on the first corner
  part and the second corner part, and is not disposed on
  the third corner part and the fourth corner part, and
the second bridge electrode is disposed on the third corner
  part and the fourth corner part, and is not disposed on
  the first corner part and the second corner part.

7. The display device of claim 6, wherein
the first voltage line and the first voltage transmission line
  are electrically connected over the first corner part and
  the second corner part, and are electrically discon-
  nected over the third corner part and the fourth corner
  part,
the second voltage line and the second voltage transmis-
  sion line are electrically connected over the third corner
  part and the fourth corner part, and are electrically
  disconnected over the first corner part and the second
  corner part.

8. The display device of claim 6, further comprising:
a third bridge electrode disposed on the first straight-line
  part of the first edge of the substrate and electrically
  connecting the first voltage line and the first voltage
  transmission line; and
a fourth bridge electrode disposed on the second straight-
  line part of the second edge of the substrate and
  electrically connecting the first voltage line and the first
  voltage transmission line, wherein
the third bridge electrode and the fourth bridge electrode
  extend in the second direction, perpendicular to the first
  direction.

9. The display device of claim 8, wherein the second
voltage line and the second voltage transmission line are
directly connected on the first straight-line part and the
second straight-line part.

10. The display device of claim 6, further comprising:
a third bridge electrode disposed on the first straight-line
  part of the first edge of the substrate and electrically
  connecting the first voltage line and the first voltage
  transmission line, wherein
the third bridge electrode extends in the second direction,
  perpendicular to the first direction, and
the first voltage line and the first voltage transmission line
  are electrically disconnected on the second straight-line
  part of the second edge of the substrate.

11. The display device of claim 10, wherein the second
voltage line and the second voltage transmission line are
directly connected on the second straight-line part, and
electrically disconnected on the first straight-line part.

12. The display device of claim 1, further comprising:
a semiconductor layer disposed on the substrate and
  including:
  a channel, a first region and a second region of a first
    transistor;

a channel of a first region and a second region of a
    second transistor; and
  a channel, a first region, and a second region of a third
    transistor;
a gate conductor comprising:
  a gate electrode of the first transistor overlapping the
    channel of the first transistor in the plan view;
  a gate electrode of the second transistor overlapping the
    channel of the second transistor in the plan view; and
  a gate electrode of the third transistor overlapping the
    channel of the third transistor in the plan view; and
a data conductor including a connection electrode elec-
  trically connecting a gate electrode of the first transistor
  and a second region of the second transistor.

13. The display device of claim 12, wherein
the first voltage line is electrically connected to the first
  region of the second transistor, and
the first voltage is a first initialization voltage.

14. The display device of claim 13, wherein the first
voltage line and the data conductor are disposed on a same
layer.

15. The display device of claim 14, wherein the first
voltage transmission line and the data conductor are dis-
posed on a same layer.

16. The display device of claim 12, wherein
the second voltage line is electrically connected to the
  second region of the third transistor, and
the second voltage is a second initialization voltage.

17. The display device of claim 16, wherein the second
voltage line and the data conductor are disposed on a same
layer.

18. The display device of claim 17, wherein the second
voltage transmission line and the data conductor are dis-
posed on a same layer.

19. The display device of claim 12, wherein
the first bridge electrode, the second bridge electrode, and
  the gate conductor are disposed on a same layer.

20. The display device of claim 12, further comprising:
a data line and a driving voltage line extending in a
  direction parallel to the first voltage line and the second
  voltage line, and
the data line, the driving voltage line, and the data
  conductor are disposed on a same layer.

21. The display device of claim 20, wherein the data line
and the driving voltage line are disposed between the first
voltage line and the second voltage line in the plan view.

22. The display device of claim 12, wherein
the display device includes pixels,
each of the pixels includes:
  the first transistor;
  the second transistor; and
  the third transistor, and
the pixels have a symmetrical shape with respect to the
  second voltage line.

* * * * *